(12) United States Patent  
Goldstein et al.

(10) Patent No.: US 9,410,674 B2  
(45) Date of Patent: Aug. 9, 2016

(54) LED LENS

(71) Applicant: Cree, Inc., Durham, NC (US)

(72) Inventors: Corey Goldstein, Mt. Pleasant, WI (US); Kurt Wilcox, Libertyville, IL (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 14/462,312

(22) Filed: Aug. 18, 2014

(65) Prior Publication Data

US 2016/0047528 A1    Feb. 18, 2016

(51) Int. Cl.

| | |
|---|---|
| *F21V 3/00* | (2015.01) |
| *F21V 5/00* | (2015.01) |
| *F21V 7/00* | (2006.01) |
| *F21V 5/04* | (2006.01) |
| *F21V 5/08* | (2006.01) |
| *H01L 25/075* | (2006.01) |
| *G02B 19/00* | (2006.01) |
| *F21W 131/103* | (2006.01) |
| *F21Y 101/02* | (2006.01) |

(52) U.S. Cl.  
CPC ............. *F21V 7/0091* (2013.01); *F21V 5/04* (2013.01); *F21V 5/08* (2013.01); *G02B 19/0014* (2013.01); *G02B 19/0061* (2013.01); *H01L 25/075* (2013.01); *F21W 2131/103* (2013.01); *F21Y 2101/02* (2013.01)

(58) Field of Classification Search  
CPC ............. F21V 5/00; F21V 5/007; F21V 5/04; F21V 5/041; F21V 5/048; F21V 7/0091; F21V 5/08; F21S 48/1216; F21S 48/125; F21S 48/1275  
USPC ................ 362/311.01–311.02, 311.06–311.1  
See application file for complete search history.

(56) References Cited

U.S. PATENT DOCUMENTS

| | | |
|---|---|---|
| 2,254,961 A | 9/1941 | Harris |
| 2,908,197 A | 10/1959 | Wells et al. |

(Continued)

OTHER PUBLICATIONS

LinkedIn webpage for LEDiL Oy; URL: https://www.linkedin.com/company/ledil-oy; retrieved from the Internet on Aug. 13, 2014.

*Primary Examiner* — Anne Hines  
*Assistant Examiner* — Jose M Diaz  
(74) *Attorney, Agent, or Firm* — Jansson Munger McKinley & Kirby Ltd.

(57) ABSTRACT

A lens for primarily forward distribution of light from a light emitter which has an emitter axis in a front-to-back centerplane. The lens has a base surface which is adjacent the emitter and forms a light-entrance opening, an inner surface which defines a light-receiving cavity and includes front and back regions extending from the light-entrance opening, and an outer surface which has front and back regions adjoined by a middle region. The back region includes a back portion configured for forward total internal reflection (TIR) of rearward light received from the inner surface. The back portion extends transverse to the front-to-back centerplane away from the base surface from positions which are closer to the base surface than the innermost cavity region and terminates with a distal end which is closer to the base surface than outermost positions of the front region. The back portion terminates laterally at positions closer to the front-to-back centerplane than lateral edges of the light-entrance opening and, in the front-to-back centerplane, the emitter axis is no farther from the back portion of the outer surface than from a back edge of the light-entrance opening.

42 Claims, 20 Drawing Sheets

(56) References Cited

U.S. PATENT DOCUMENTS

| | | | |
|---|---|---|---|
| 5,813,743 A | 9/1998 | Naka | |
| 5,926,320 A | 7/1999 | Parkyn, Jr. et al. | |
| 7,083,313 B2 | 8/2006 | Smith | |
| 7,118,236 B2 | 10/2006 | Hahm et al. | |
| 7,118,262 B2 | 10/2006 | Negley | |
| 7,153,000 B2 | 12/2006 | Park et al. | |
| 7,153,002 B2 | 12/2006 | Kim et al. | |
| 7,181,378 B2 | 2/2007 | Benitez et al. | |
| 7,213,945 B2 | 5/2007 | Yoneda et al. | |
| 7,246,931 B2 | 7/2007 | Hsieh et al. | |
| 7,254,309 B1 | 8/2007 | Chou et al. | |
| 7,329,029 B2 | 2/2008 | Chaves et al. | |
| 7,352,011 B2 | 4/2008 | Smits et al. | |
| 7,410,275 B2 | 8/2008 | Sommers et al. | |
| 7,411,742 B1 | 8/2008 | Kim et al. | |
| 7,549,769 B2 | 6/2009 | Kim et al. | |
| 7,674,018 B2 | 3/2010 | Holder et al. | |
| 7,766,509 B1 | 8/2010 | Laporte | |
| 7,854,536 B2 | 12/2010 | Holder et al. | |
| 7,857,497 B2 * | 12/2010 | Koike | F21S 8/088 362/234 |
| 7,866,837 B2 | 1/2011 | Ho | |
| 7,901,098 B2 | 3/2011 | Saitoh et al. | |
| 7,918,590 B1 | 4/2011 | Li et al. | |
| 7,922,369 B2 | 4/2011 | Condon et al. | |
| 7,942,558 B2 | 5/2011 | Zweig et al. | |
| 8,215,814 B2 | 7/2012 | Marcoux | |
| 8,348,475 B2 | 1/2013 | Wilcox et al. | |
| 8,388,193 B2 | 3/2013 | Wilcox et al. | |
| 8,511,864 B2 | 8/2013 | Holder et al. | |
| 8,582,053 B2 * | 11/2013 | Iiyama | G02F 1/133606 349/62 |
| D708,387 S * | 7/2014 | Castillo | D26/120 |
| D718,490 S * | 11/2014 | Castillo | D26/120 |
| 9,127,819 B2 * | 9/2015 | Wilcox | F21V 5/04 |
| 2004/0037076 A1 | 2/2004 | Katoh et al. | |
| 2004/0114355 A1 | 6/2004 | Rizkin et al. | |
| 2004/0156209 A1 | 8/2004 | Ishida | |
| 2004/0207999 A1 | 10/2004 | Suehiro et al. | |
| 2005/0224826 A1 | 10/2005 | Keuper et al. | |
| 2006/0082999 A1 | 4/2006 | Klein | |
| 2006/0198144 A1 | 9/2006 | Miyairi et al. | |
| 2007/0019416 A1 | 1/2007 | Han et al. | |
| 2007/0201225 A1 * | 8/2007 | Holder | F21K 9/00 362/227 |
| 2008/0101063 A1 | 5/2008 | Koike et al. | |
| 2008/0205061 A1 | 8/2008 | Holder et al. | |
| 2008/0239722 A1 * | 10/2008 | Wilcox | F21V 5/04 362/268 |
| 2009/0086498 A1 | 4/2009 | Condon et al. | |
| 2009/0290361 A1 * | 11/2009 | Ruud | F21S 8/02 362/365 |
| 2010/0073927 A1 | 3/2010 | Lewin et al. | |
| 2010/0073928 A1 * | 3/2010 | Kim | F21V 5/04 362/245 |
| 2010/0085763 A1 | 4/2010 | Aguglia | |
| 2010/0110695 A1 | 5/2010 | Nakamura | |
| 2010/0128488 A1 | 5/2010 | Marcoux | |
| 2011/0063857 A1 * | 3/2011 | Li | F21V 5/007 362/336 |
| 2011/0122619 A1 * | 5/2011 | Wilcox | F21V 5/04 362/245 |
| 2011/0279751 A1 * | 11/2011 | Iiyama | F21V 5/04 349/64 |
| 2012/0268943 A1 * | 10/2012 | Walczak | F21V 5/04 362/294 |
| 2012/0307495 A1 * | 12/2012 | Shih | G02B 19/0066 362/237 |
| 2012/0320585 A1 * | 12/2012 | Lin | F21V 5/007 362/239 |
| 2013/0147347 A1 * | 6/2013 | Laporte | F21V 5/007 313/512 |
| 2014/0160767 A1 * | 6/2014 | Chen | F21V 5/002 362/308 |

* cited by examiner

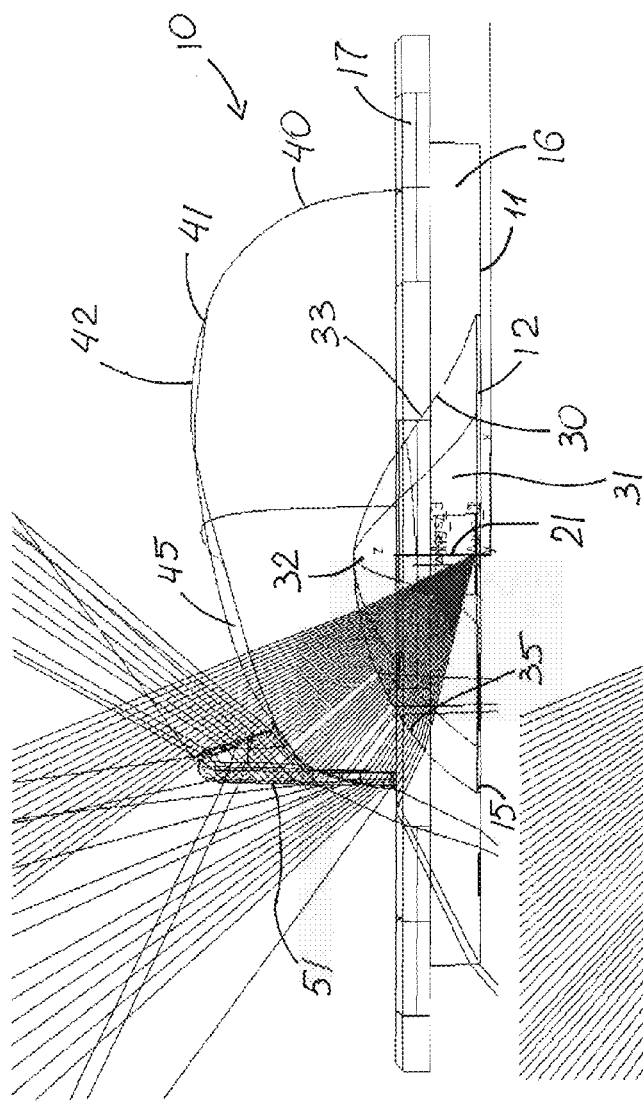
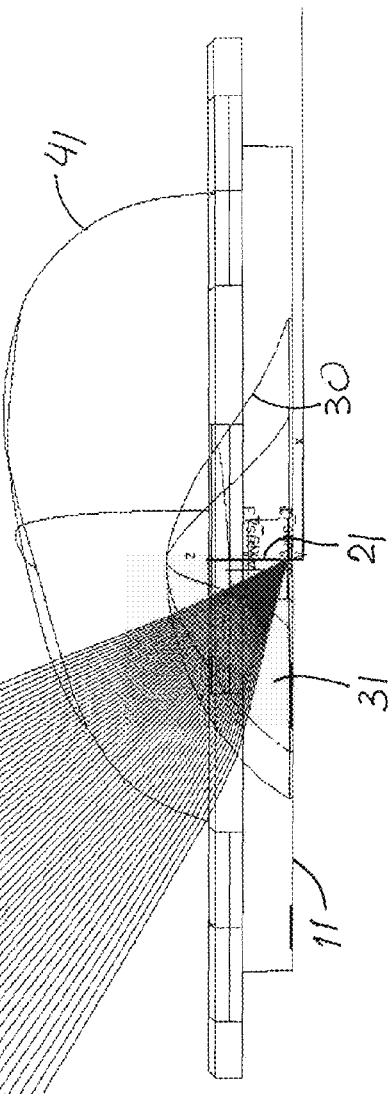
FIG. 4
FIG. 5

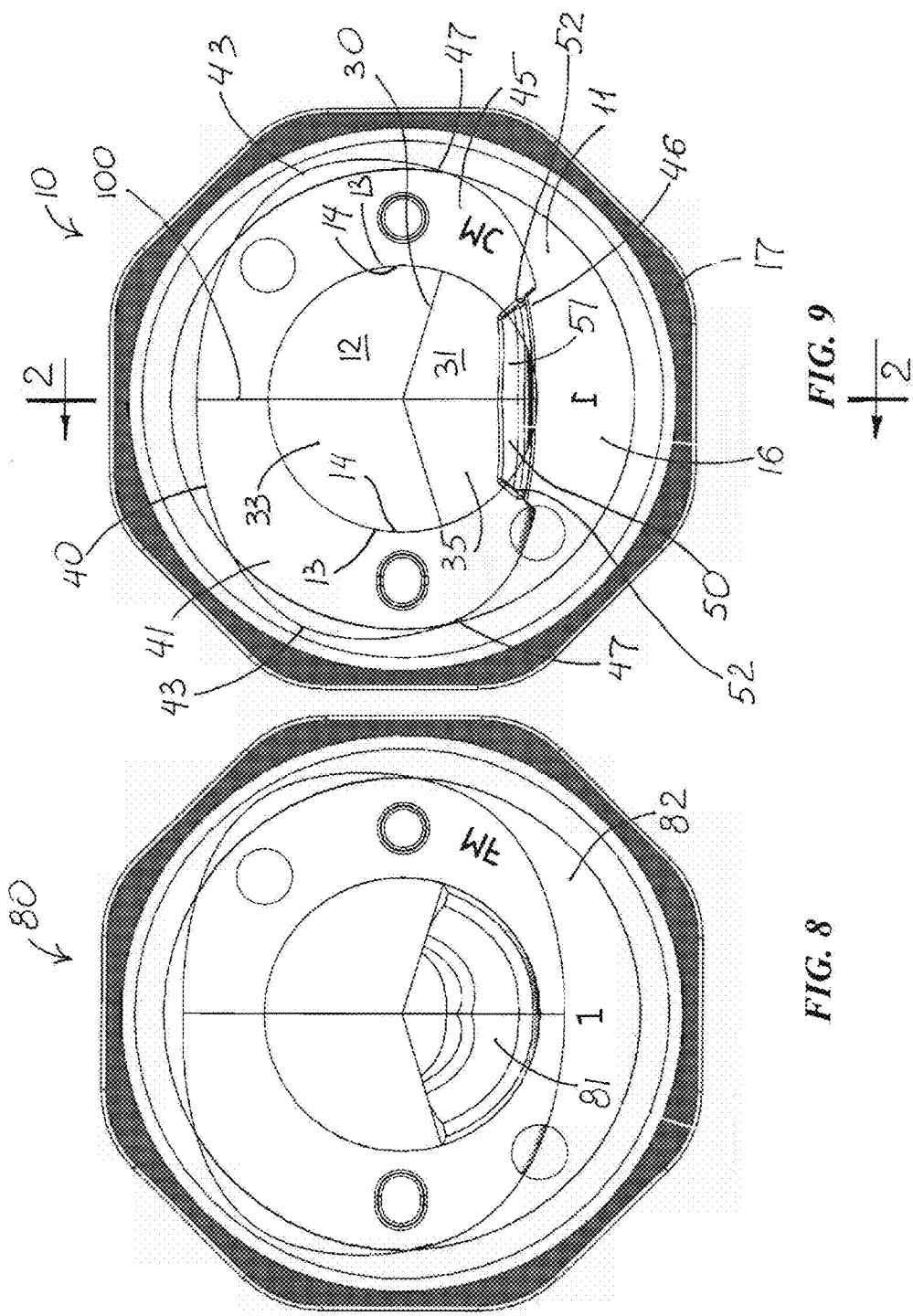

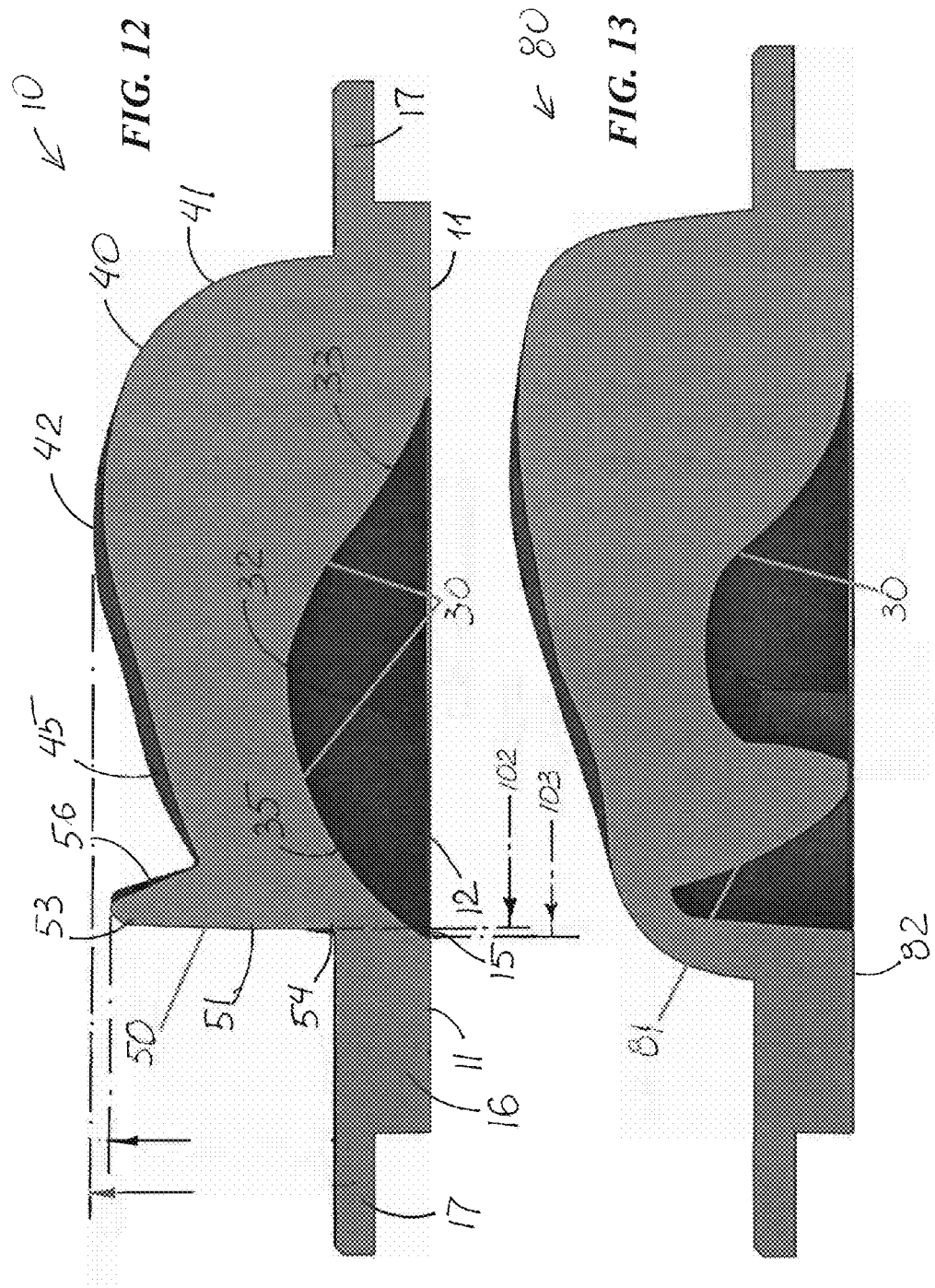

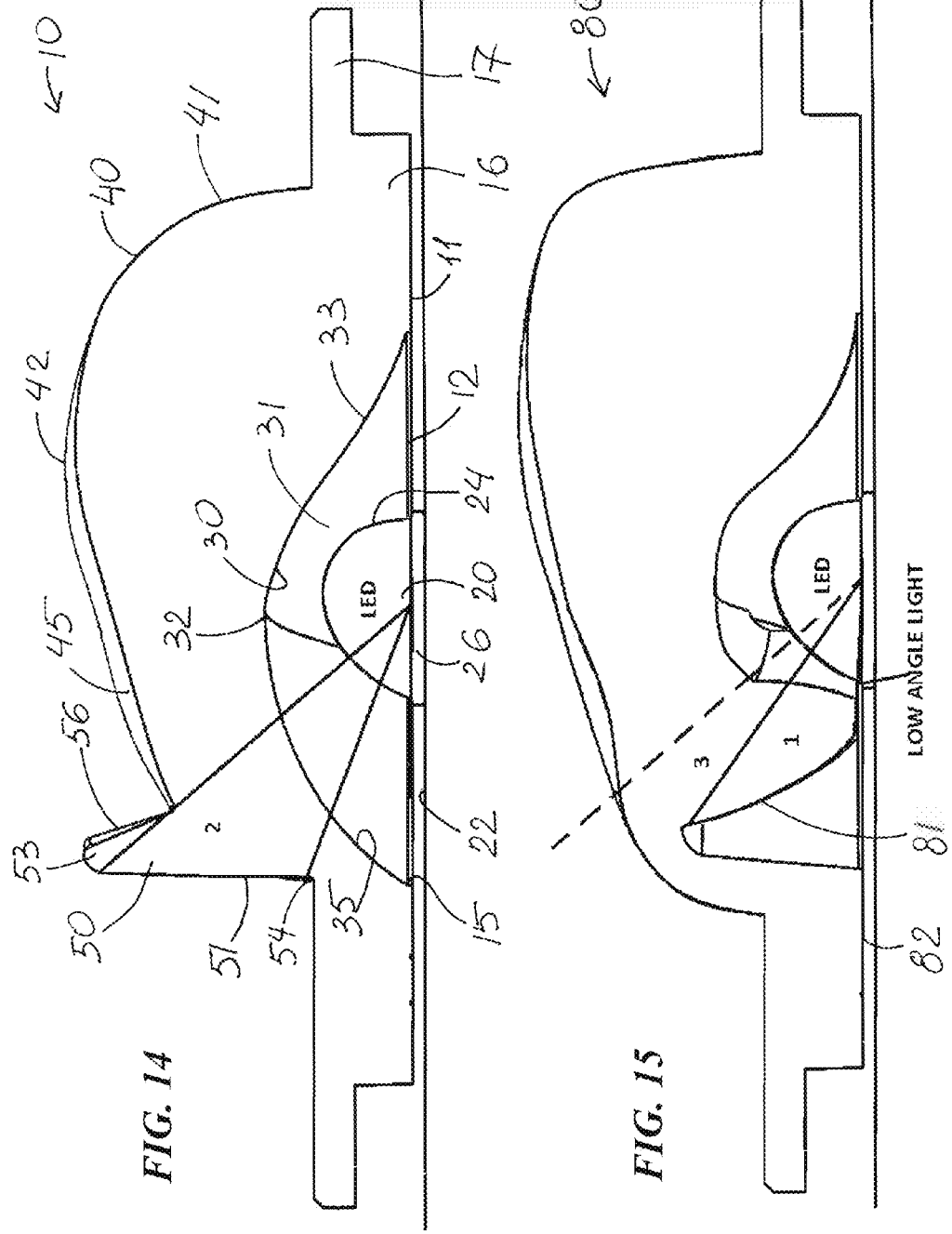

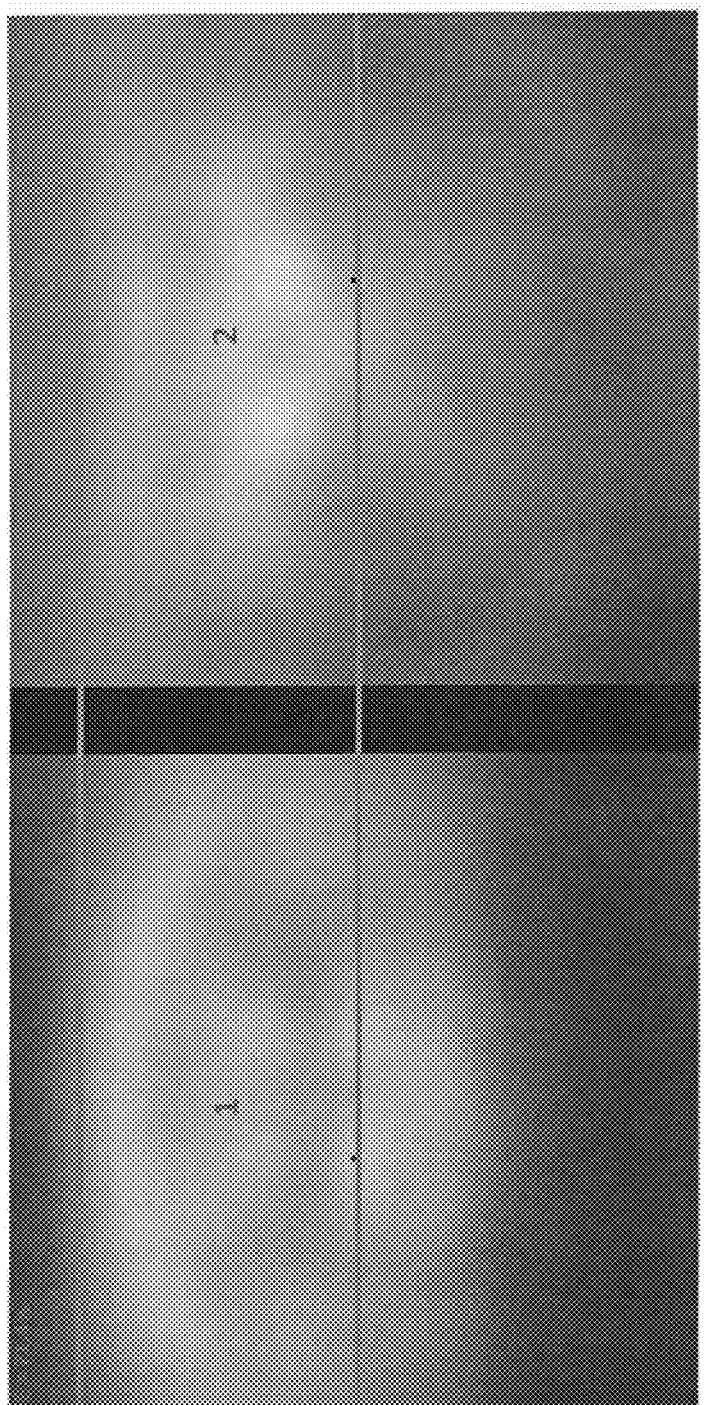
*FIG. 19*
*FIG. 18*
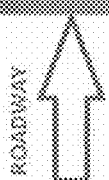

ously.
LED LENS

FIELD OF THE INVENTION

This invention relates generally to the field of LED lighting apparatus and, more particularly, to the field of LED-based optical systems for use in LED lighting fixtures for which there are particular light-distribution requirements, such as what is sometimes referred to as preferential-side light distribution—for roadway light fixtures and the like.

BACKGROUND OF THE INVENTION

In recent years, the use of light-emitting diodes (LEDs) for various common lighting purposes has increased, and this trend has accelerated as advances have been made in LEDs, LED arrays, and specific components. Indeed, lighting applications which previously had typically been served by fixtures using what are known as high-intensity discharge (HID) lamps are now being served by LED lighting fixtures. Such lighting applications include, among a good many others, roadway lighting, factory lighting, parking lot lighting, and commercial building lighting.

In many of such products, achieving high levels of illumination over large areas with specific light-distribution requirements is particularly important. One pertinent example is fixtures for roadway lighting, an application in which the fixtures are generally placed along roadway edges while light distribution is desired along a significant portion of roadway length and, of course, on the roadway itself—generally to the exclusion of significant light off the roadway.

Providing roadway light from light fixtures along the roadway may be referred to as "primarily forward" illumination which minimizes rearward illumination. It is desirable that such primarily forward illumination be achieved with minimal use of complex reflectors and/or minimal varying in orientations of multiple light sources.

SUMMARY OF THE INVENTION

The present invention is a lens for primarily forward distribution of light from a light emitter which has an emitter axis in a front-to-back centerplane. The lens has a base surface, an inner surface and an outer surface. The base surface is adjacent the emitter and forms a light-entrance opening. The inner surface defines a light-receiving cavity and includes front and back regions which extend from the light-entrance opening to an innermost region of the cavity. The outer surface includes front and back regions adjoined by a middle region. The back region includes a back surface portion which extends in a direction away from the base surface to terminate with a distal end, the back surface portion being configured for forward total internal reflection (TIR) of rearward light received from the inner surface.

In certain embodiments, the back region extends from positions which are closer to the base surface than the innermost cavity region. The distal end may be closer to the base surface than outermost positions of the front region.

The back portion of the outer surface extends transverse the front-to-back centerplane in a direction away from the base surface. In some embodiments, the back portion terminates laterally at positions which are closer to the front-to-back centerplane than positions of lateral edges of the light-entrance opening. In certain embodiments, the back portion terminates laterally at positions which are closer to the front-to-back centerplane than lateral positions of the front region of the outer surface.

In some embodiments, the back portion of the outer surface may be positioned such that, in the front-to-back centerplane, the emitter axis is either closer to the back portion or is at equal distance therefrom than from a back edge of the light-entrance opening. In other words, the emitter axis may be no farther from the back portion of the outer surface than from rearmost positions of the light-entrance opening along the back region of the inner surface. The back portion of the back region may be disposed in a recess defined by the middle region.

In some embodiments, the back region includes a minor forward portion extending from the distal end toward the emitter to adjoin the middle region, the minor forward portion positioned for receiving light reflected from the back portion. The minor forward portion may be configured for refraction of the received light in a desired direction.

In some embodiments, lateral positions of the front region of the outer surface are farther from the front-to-back centerplane than lateral positions of the middle and back regions. The front and middle regions of the outer surface may be smoothly adjoined and each have a substantially smooth configuration.

In certain embodiments, the lens further includes a peripheral region extending radially outwardly from the light-entrance opening and including the base surface. The peripheral region may include a flange extending radially away from the outer surface.

In certain embodiments, the back region of the inner surface has a substantially smooth cross-sectionally concave configuration. The front region of the inner surface may be substantially cross-sectionally convex along the light-entrance opening into the light-receiving cavity. The inner surface may be substantially smooth. In some embodiments, the light-entrance opening is substantially circular.

The light emitter may be an LED emitter which may include a single LED or a closely-spaced group of LEDs mounted either directly on the board (e.g., a circuit board) or in the form of an LED package with the LED(s) on a submount on the board. The LED emitter may include what is commonly referred to as a primary lens over the LED(s). In some embodiments, the primary lens has an outer surface shaped for primarily forward refraction of light from the at least one LED. The outer surface of the primary lens may be asymmetric in planes substantially parallel to the front-to-back centerplane.

In the embodiments with the LED emitter including the primary lens, the inventive lens is a so-called secondary lens placed over the primary lens. In some other embodiments, the lens according to the present invention may be the primary lens directly over the LED(s).

As used herein in referring to portions of the devices of this invention, the terms "upward," "upwardly," "upper," "downward," "downwardly," "lower," "upper," "top," "bottom," "over" and other like terms are used in order to facilitate description of the relationship between parts of the invention and do not limit the invention to any particular orientation.

In descriptions of this invention, including in the claims below, the terms "comprising," "including" and "having" (each in their various forms) and the term "with" are each to be understood as being open-ended, rather than limiting, terms.

BRIEF DESCRIPTION OF THE DRAWINGS

FIG. 4 is still another side elevation of the lens of FIG. 1 showing redirection of LED light emitted rearwardly.

FIG. 5 is a side elevation of another lens with an outer surface lacking a back portion configured for TIR of LED light emitted rearwardly.

FIGS. 7 and 8 are plan views of the lens of FIG. 6 seen from the light output side, FIG. 7 schematically illustrating the light distribution by the lens.

FIG. 9 is a plan view of the lens of FIG. 1 seen from the light output side.

FIG. 12 is an opaque cross-sectional view of the lens of FIG. 1 taken along plane 9-9 as indicated in FIG. 9 and showing the geometric configuration of light-modifying surfaces surrounding the emitter.

FIG. 13 is an opaque cross-sectional view of the lens of FIG. 6 taken along plane front-to-back plane 13-13 as indicated in FIG. 7.

FIG. 14 is an opaque cross-sectional view of the lens of FIG. 1, as in FIG. 14, and showing an LED emitter and the range of angles of rearward light received by the outer-surface back portion for forward TIR.

FIG. 15 is an opaque cross-sectional view of the lens of FIG. 6, as in FIG. 13, and showing an LED emitter and the range of angles of rearward light that escapes the TIR surface.

FIG. 18 is the luminance rendering of light distribution as in FIG. 16 shown on a roadway and illustrating a relatively high roadway target efficacy (RTE) by the lens of FIG. 1.

FIG. 19 is the luminance rendering of light distribution on a roadway by an alternative lens other than the lens according to the present invention and illustrating a lower RTE by such alternative lens.

DETAILED DESCRIPTION OF EXEMPLARY EMBODIMENTS

The FIGURES show aspects of an exemplary embodiment of a lens 10 in accordance with this invention. Lens 10 is for primarily forward distribution of light from a light emitter 20 which has an emitter axis 21 in a front-to-back centerplane 100. The LED emitter may include a single LED or a group of a plurality of LEDs mounted either directly on a circuit board or on a submount of an LED package on the board. A primary lens may be disposed directly over the LED(s). While the primary lens over the LED(s) may be a lens according to the present invention, in illustrated embodiments, lens 10 is a secondary lens placed over the primary lens, best seen in FIGS. 2 and 14.

Figure 1:
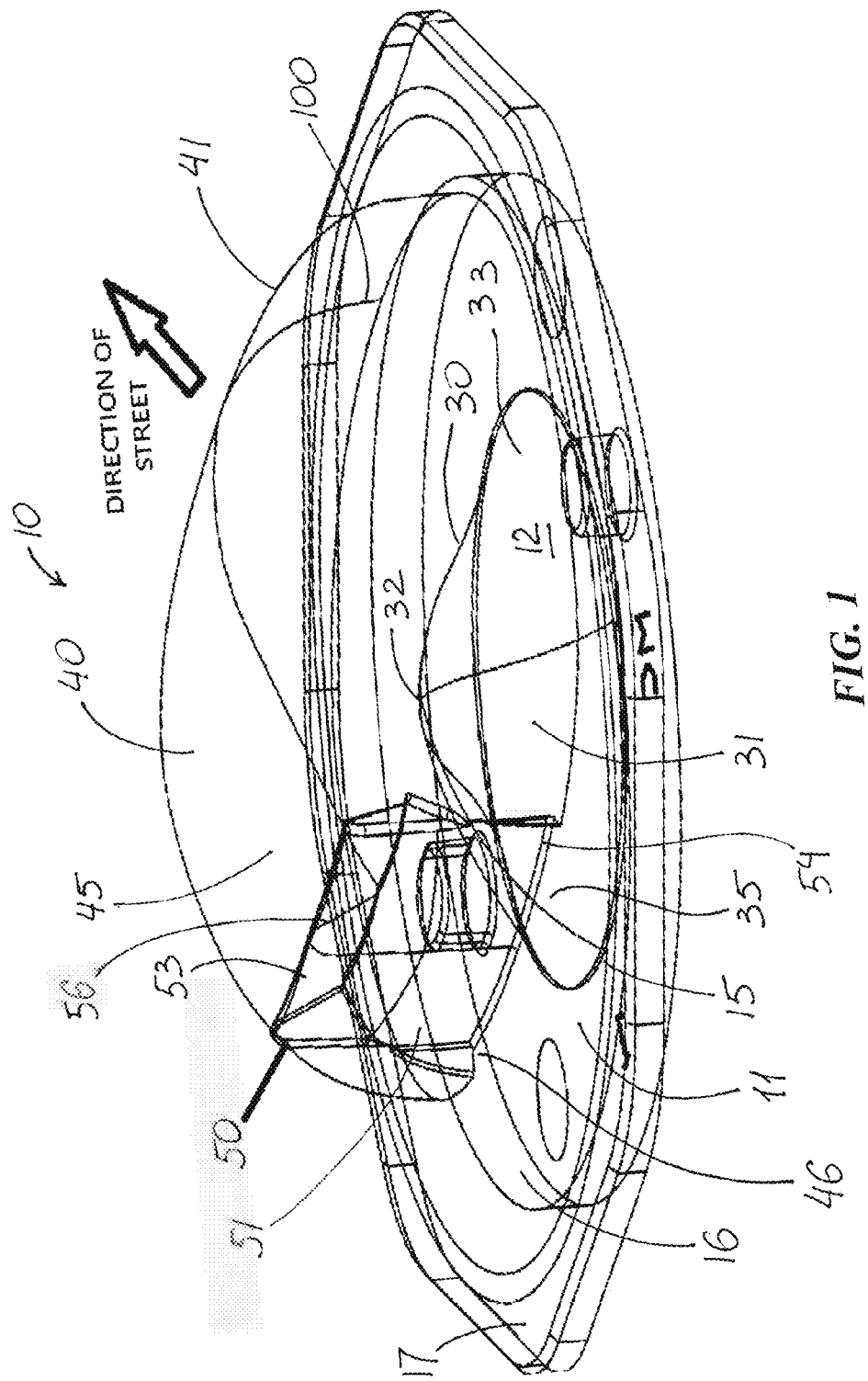
FIG. 1 is a transparent rear perspective view of an embodiment of the lens of the present invention.
Figure 2:
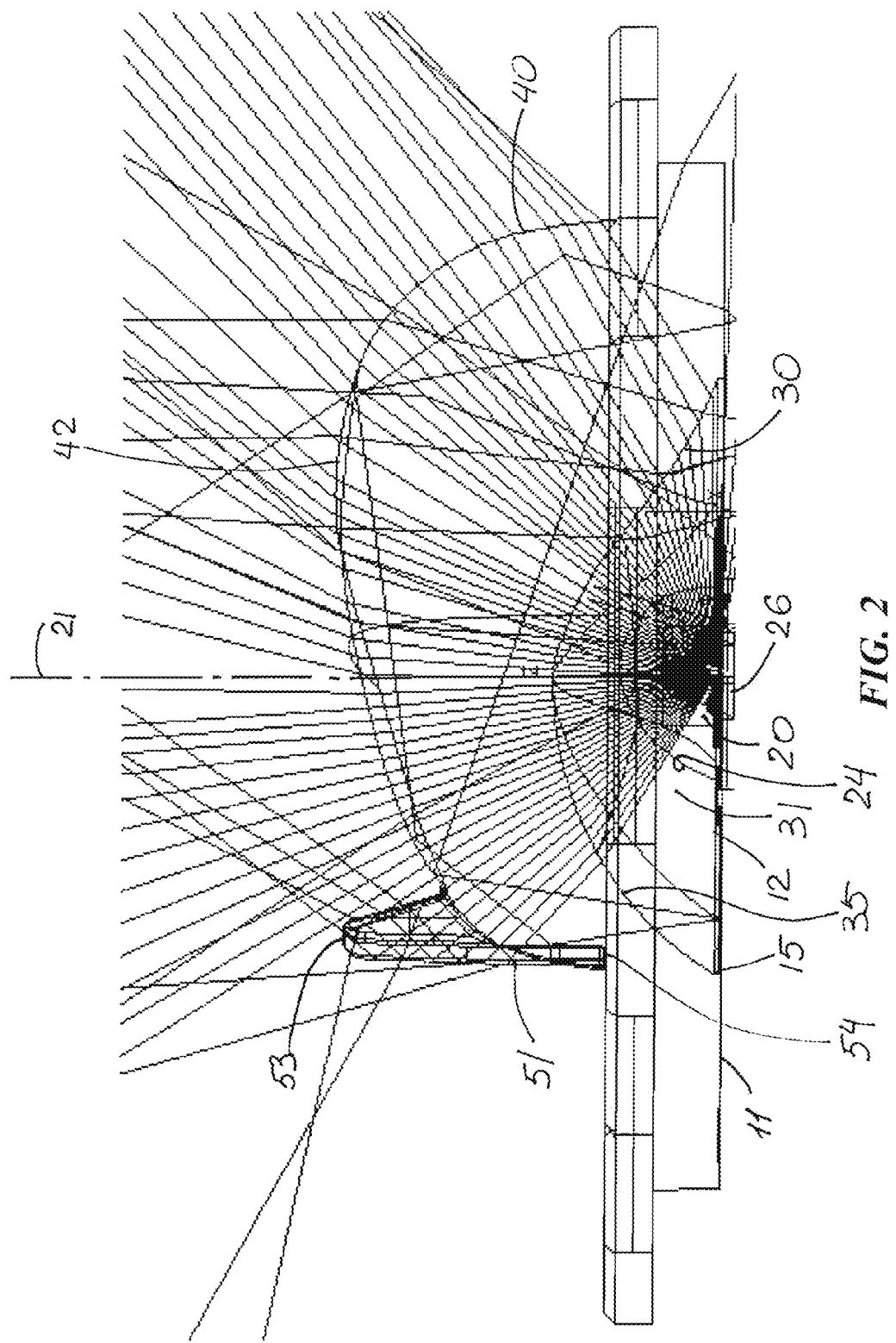
FIG. 2 is a side elevation of the lens of FIG. 1 with rays representing direction of light by the lens surfaces in front-to-back plane 2-2 as indicated in FIG. 9.

FIGS. 1-4 and 9-12 best show that lens 10 has a base surface 11, an inner surface 30 and an outer surface 40. As seen in FIGS. 2 and 14, base surface 11 is adjacent emitter 20 and forms a light-entrance opening 12. Inner surface 30 defines a light-receiving cavity 31 and includes a front region 33 and a back region 35 which extend from light-entrance opening 12 to an innermost region 32 of cavity 31. Outer surface 40 includes a front region 41 and a back region 50 adjoined by a middle region 45. Back region 50 includes a back surface portion 51 which extends in a direction away from base surface 11 to terminate with a distal end 53. As illustrated in FIGS. 2-4 and 10, back surface portion 51 is configured for forward total internal reflection (TIR) of rearward light received from back region 35 of inner surface 30.

FIGS. 2-4, 12 and 14 show back region 50 extending from positions 54 along emitter axis 21 which are closer to base surface 11 than innermost cavity region 32. FIG. 12 best shows distal end 53 being closer to base surface 11 than outermost positions 42 of front region 41.

Figure 10:
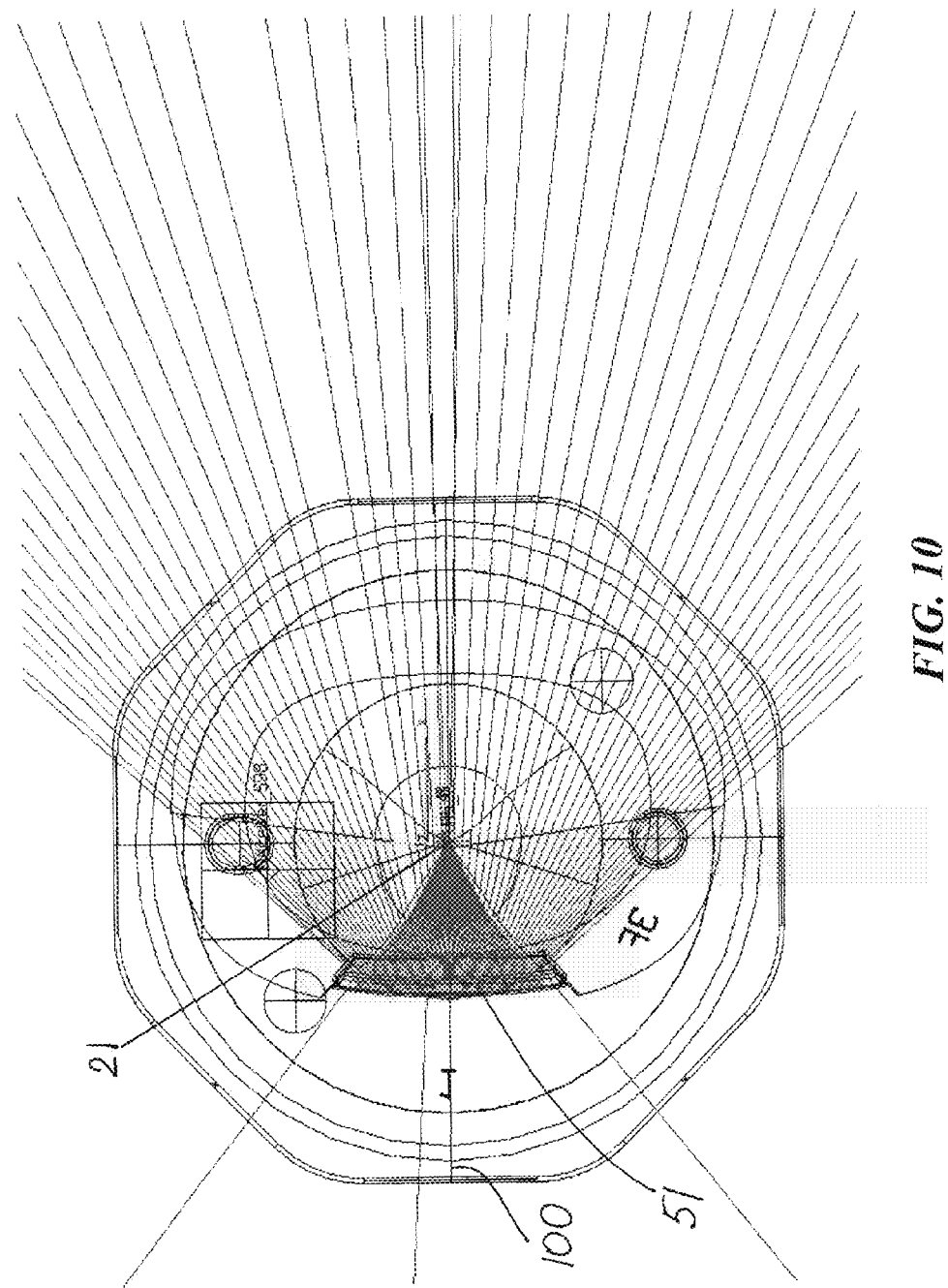
FIG. 10 is another plan view of the lens of FIG. 1 seen from the light output side and schematically illustrating the light distribution by the lens.
Figure 11:
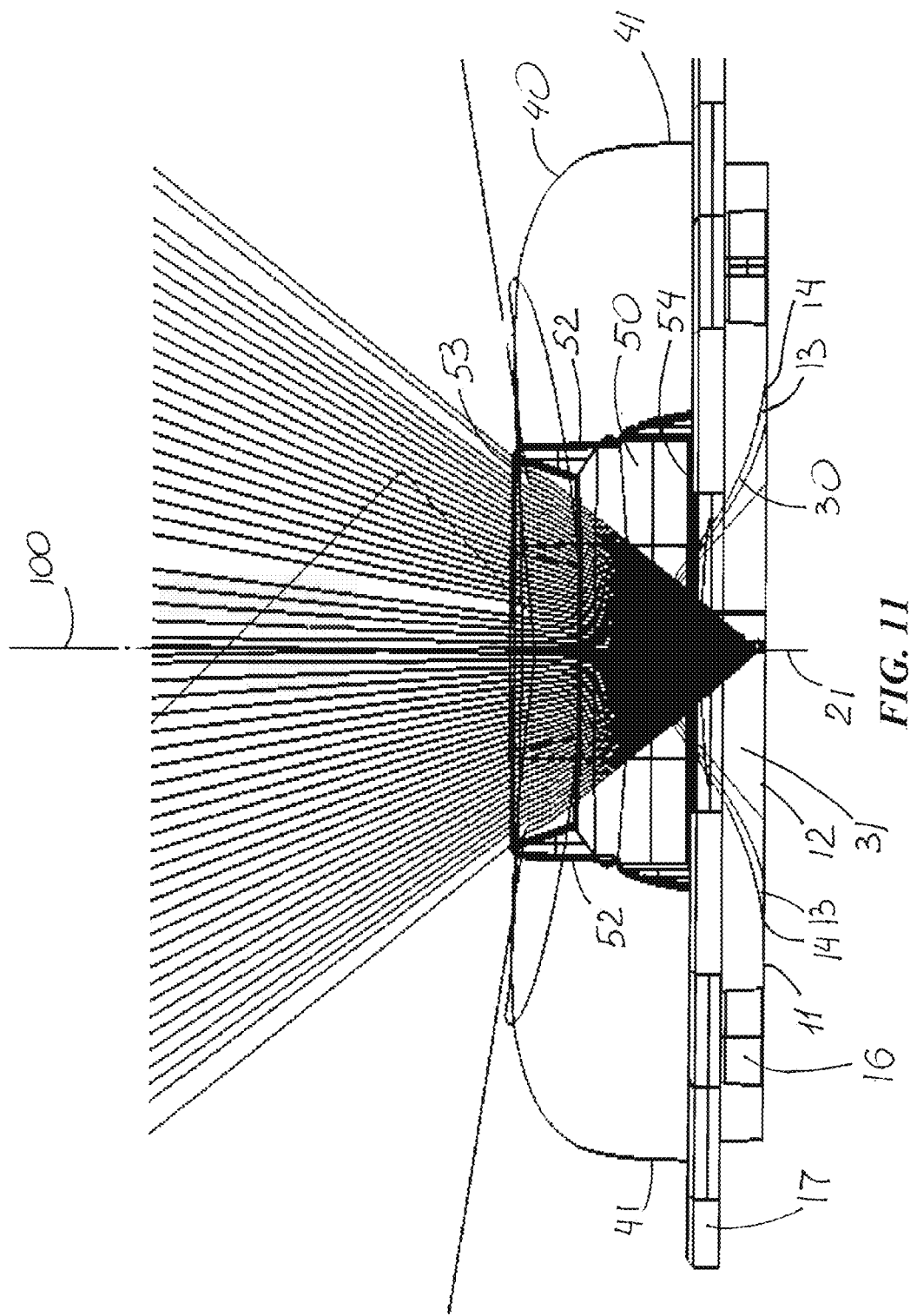
FIG. 11 is a rear view of the lens of FIG. 1 schematically illustrating the light distribution by the lens seen from the light output side.

FIG. 1 shows back portion 51 of outer surface 40 extending transverse front-to-back centerplane 100 in a direction away from base surface 11. It is best seen in FIGS. 9 and 10 that back portion 51 terminates laterally at lateral positions 52 which are closer to front-to-back centerplane 100 than lateral positions 13 of lateral edges 14 of light-entrance opening 12. FIGS. 9 and 10 also show back portion 51 terminating laterally at positions 52 which are closer to front-to-back centerplane 100 than lateral positions 43 of front region 41 of outer surface 40.

FIGS. 2-4, 12 and 14 best show back portion 51 of outer surface 40 positioned along front-to-back centerplane 100 such that emitter axis 21 is closer to back portion 51 or is at equal distance therefrom than from a back edge 15 of light-entrance opening 12, as best illustrated in FIG. 12. As also seen in FIGS. 9 and 10, back portion 51 is disposed no more rearwardly than back edge 15 of light-entrance opening 12. FIGS. 9 and 10 also show back portion 51 of back region 50 disposed in a recess 46 defined by middle region 45.

FIGS. 8 and 9 illustrate the difference in plan view configurations of a lens 80 with an internal TIR surface 81 (shown in FIG. 8) and lens 10 according to the present invention with external TIR surface portion 51 (shown in FIG. 9).

Figure 3:
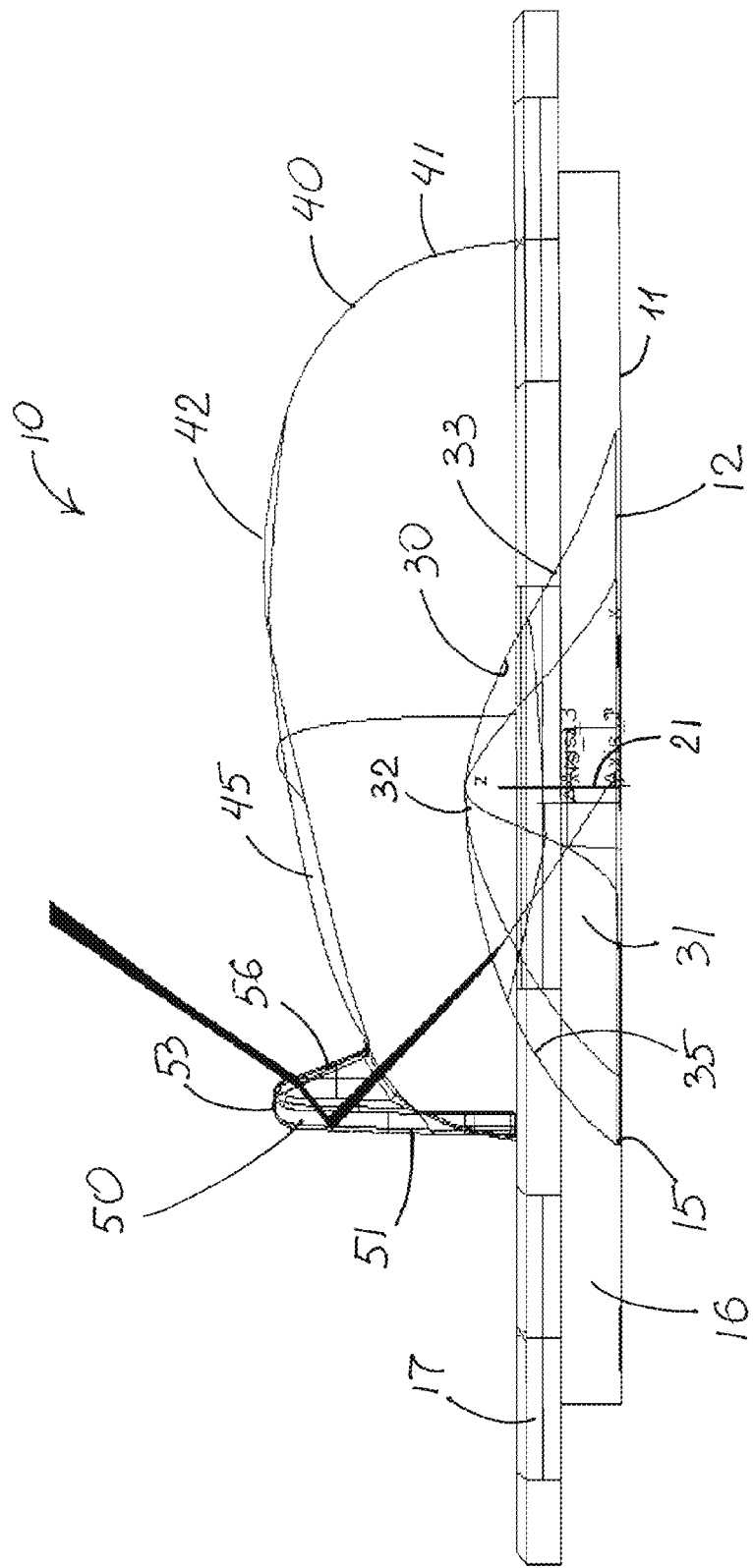
FIG. 3 is another side elevation of the lens of FIG. 1 showing a path of a single strand of light rays emitted rearwardly.

FIGS. 1-4, 12 and 14 show that back region 50 includes a minor forward portion 56 extending from distal end 53 in a direction toward emitter 20 to adjoin middle region 45. FIGS. 2-4 best illustrate that minor forward portion 56 is positioned for receiving light reflected from back portion 51. FIG. 3 best shows minor forward portion 56 configured for refraction of the received light to higher angles from the base surface. It should be understood that the minor forward portion of the back region of the outer lens surface may be configured for refraction of the received light in directions closer to the base surface or for passing such light without any refraction.

In some alternative embodiments, the outer surface may be configured such that the back portion directly adjoins the middle region such that light reflected from the back surface portion exits the lens through the middle and/or front region(s).

FIGS. 9 and 10 best show that lateral positions 43 of front region 41 of outer surface 40 are farther from front-to-back centerplane 100 than lateral positions 52 of back region 50 or lateral positions 47 of middle region 45.

It is seen in FIGS. 1-4, 12 and 14 that front and middle regions 41 and 45 of outer surface 40 are smoothly adjoined and each have a substantially smooth configuration.

Lens 10 further includes a peripheral region 16 extending radially outwardly from light-entrance opening 12 and including base surface 11. FIGS. 1-4, 9-12 and 14 show peripheral region 16 including a flange 17 which extends radially away from outer surface 40.

FIGS. 30-34 show lighting apparatus 60 which includes a plurality of lenses 10 according to the present invention. Lighting apparatus 10 is configured for use with a plurality of LED light emitters 20 spaced along a circuit board 22 and each defining a corresponding axis 21 with each lens 10 corresponding to one of LED light emitters 20.

In some embodiments, such lighting apparatus may be an integral piece which includes a plurality of lens portions interconnected by their flanges formed as a single flange member surrounding the lens portions, each of which includes one of the plurality of lenses according to the present invention.

FIGS. 30-34 show lighting apparatus 60 as an optical member which has a carrier portion 61 surrounding a plurality of lenses, each according to the present invention. Carrier portion 61 may be polymeric and overlaps with and is molded onto the lens flanges across such overlapping. Such one-piece optical member and a method of manufacturing are described in detail in application Ser. No. 13/843,649, filed Mar. 15, 2013, the entire contents of which are incorporated herein by reference.

In fixtures utilizing a plurality of emitters, a plurality of LEDs or LED arrays may be disposed directly on a common submount in spaced relationship between the LEDs or LED arrays. This type of LED emitters is sometimes referred to as chip-on-board LEDs. In some other embodiments, each of LEDs is on a submount and each of the submounts is mounted on the circuit board. In some of such embodiments, each of the LEDs or LED arrays may be overmolded with a respective primary lens. In some examples, a lens according to the present invention may form the primary lens over a respective one of the LEDs or LED arrays.

Figure 28:
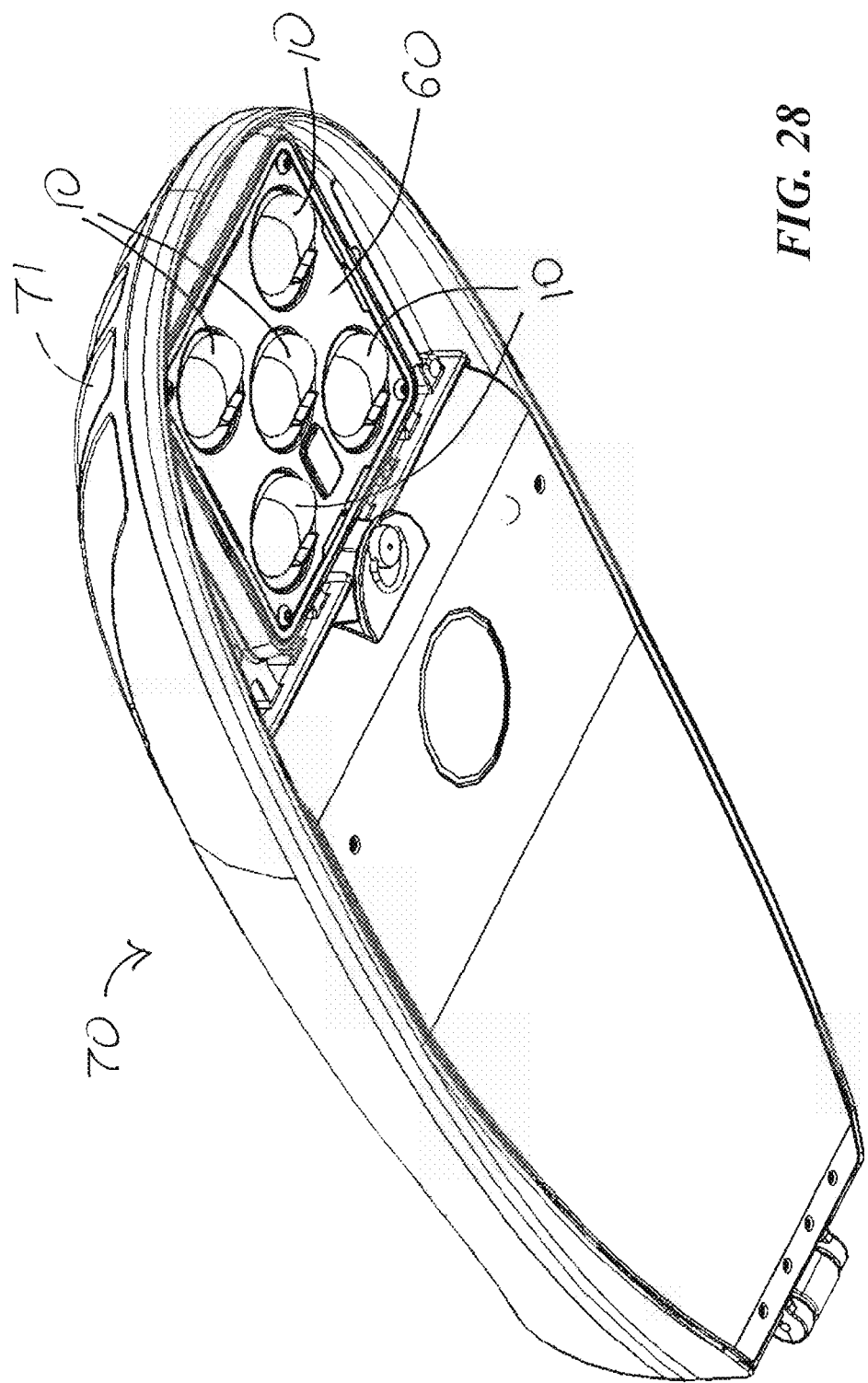
FIG. 28 is a perspective view of a light fixture incorporating a one-piece lensing member incorporating a plurality of the lenses according to the present invention.
Figure 29:
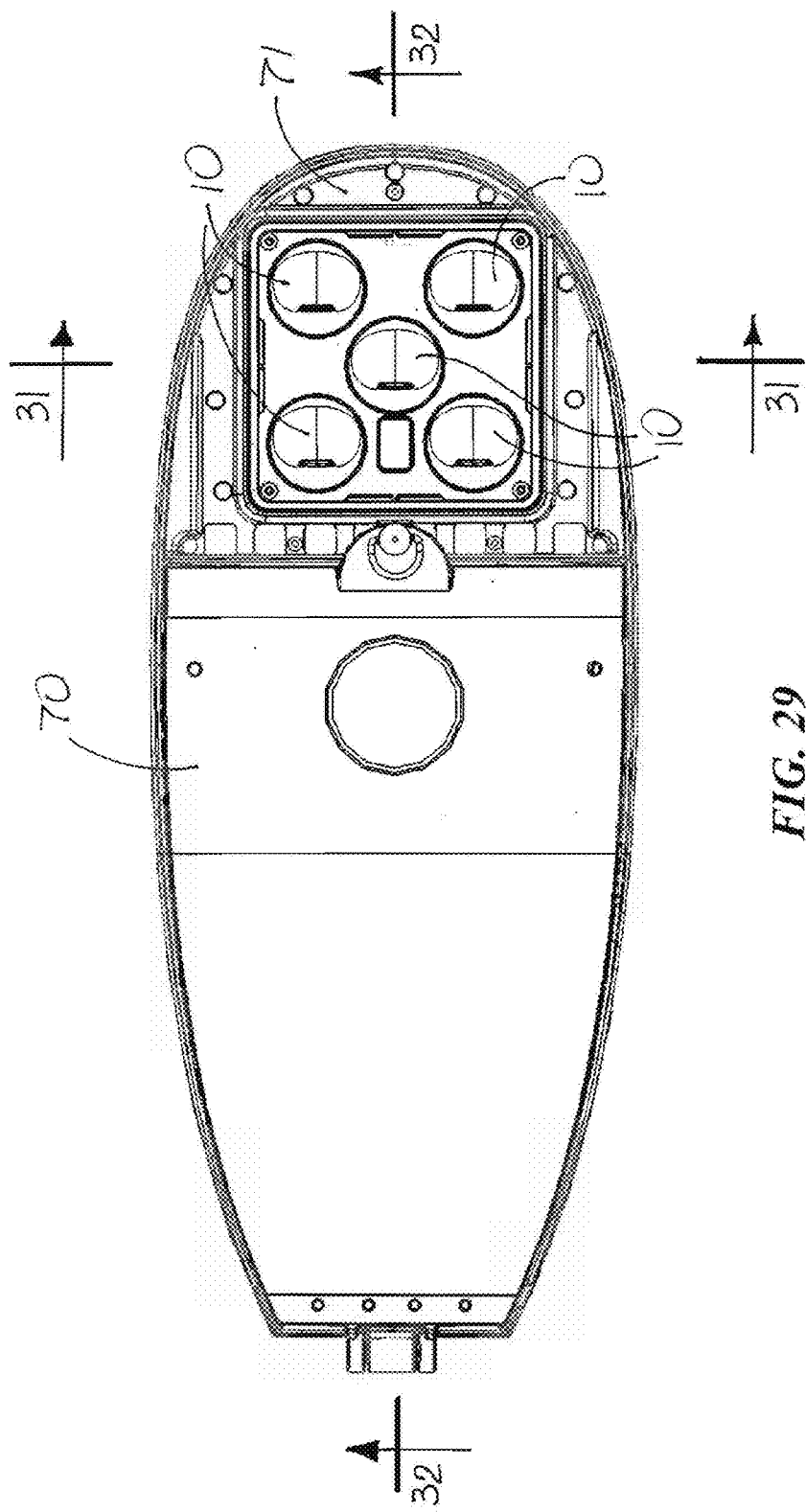
FIG. 29 is a plan view of the light fixture of FIG. 28.
Figure 30:
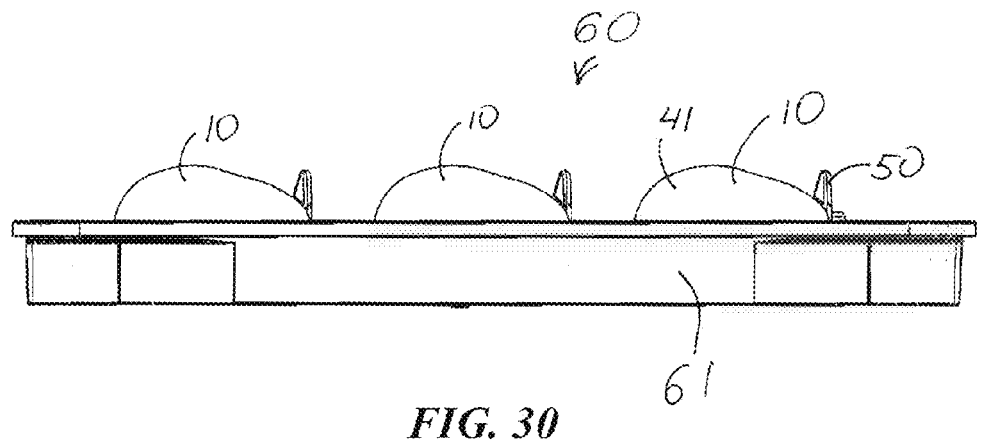
FIG. 30 is a side elevation of the one-piece lensing member seen in FIG. 28.
Figure 31:
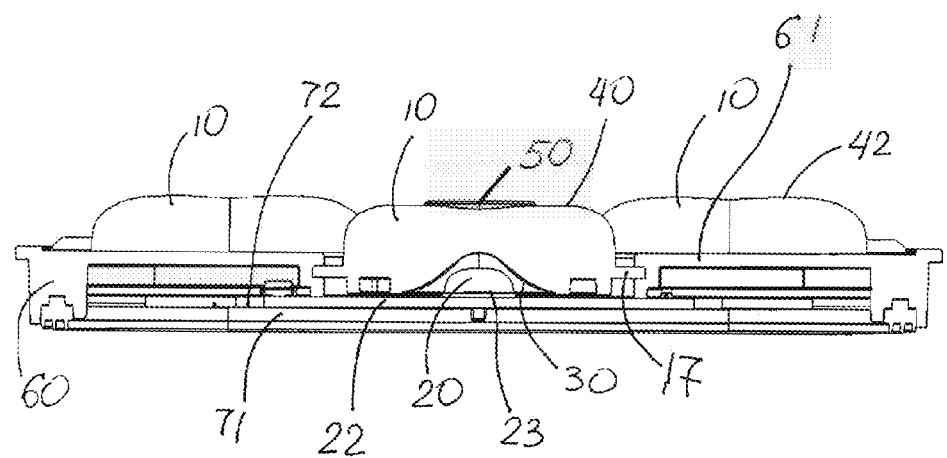
FIG. 31 is a fragmentary cross-sectional view of the light fixture of FIG. 28 taken along plane 31-31 shown on FIG. 29.
Figure 32:
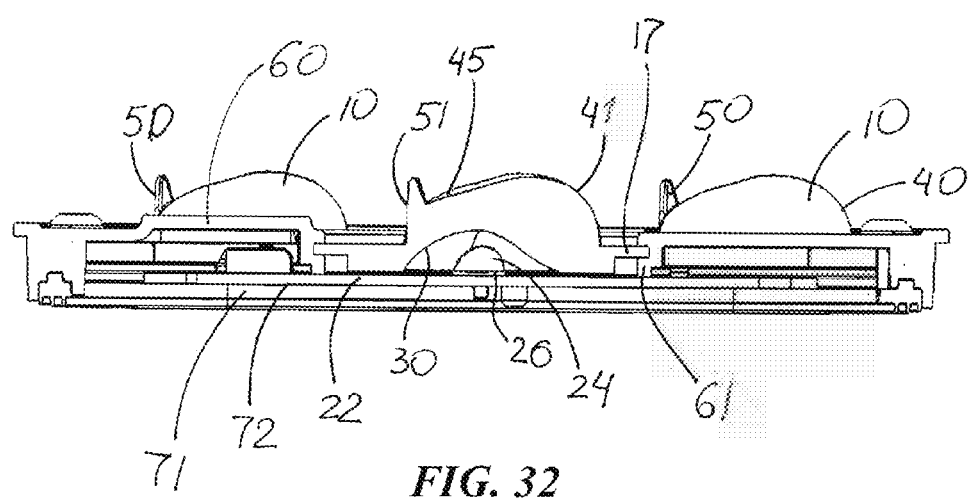
FIG. 32 is a fragmentary cross-sectional view of the light fixture of FIG. 28 taken along plane 32-32 shown on FIG. 29.
Figure 33:
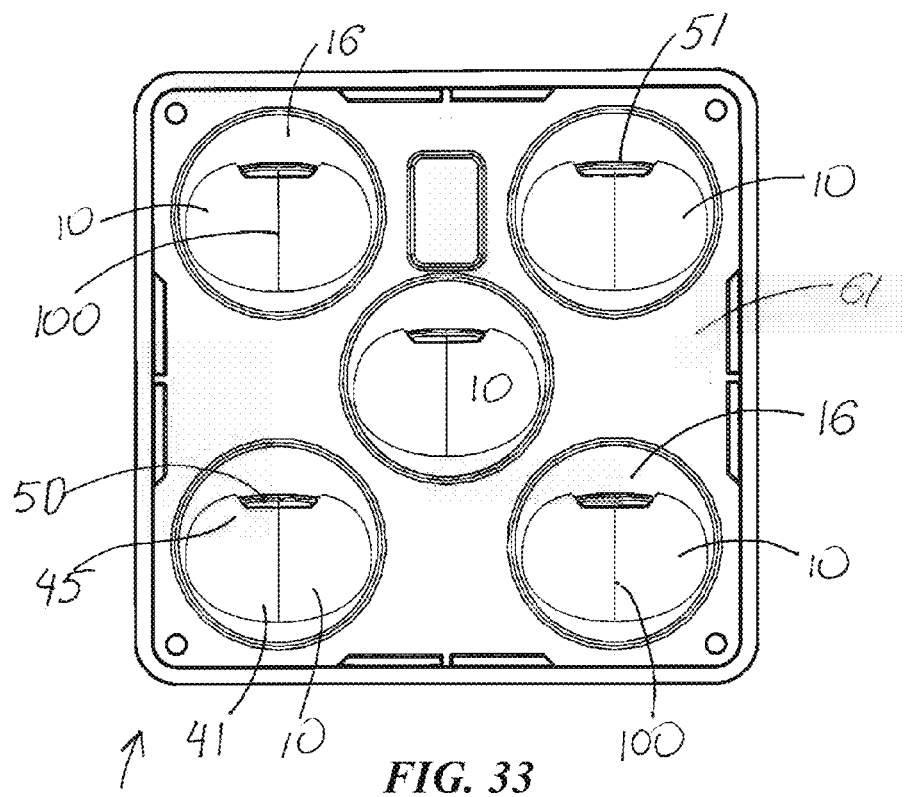
FIG. 33 is a plan view from the light-output side of the lighting apparatus of FIG. 30.
Figure 34:
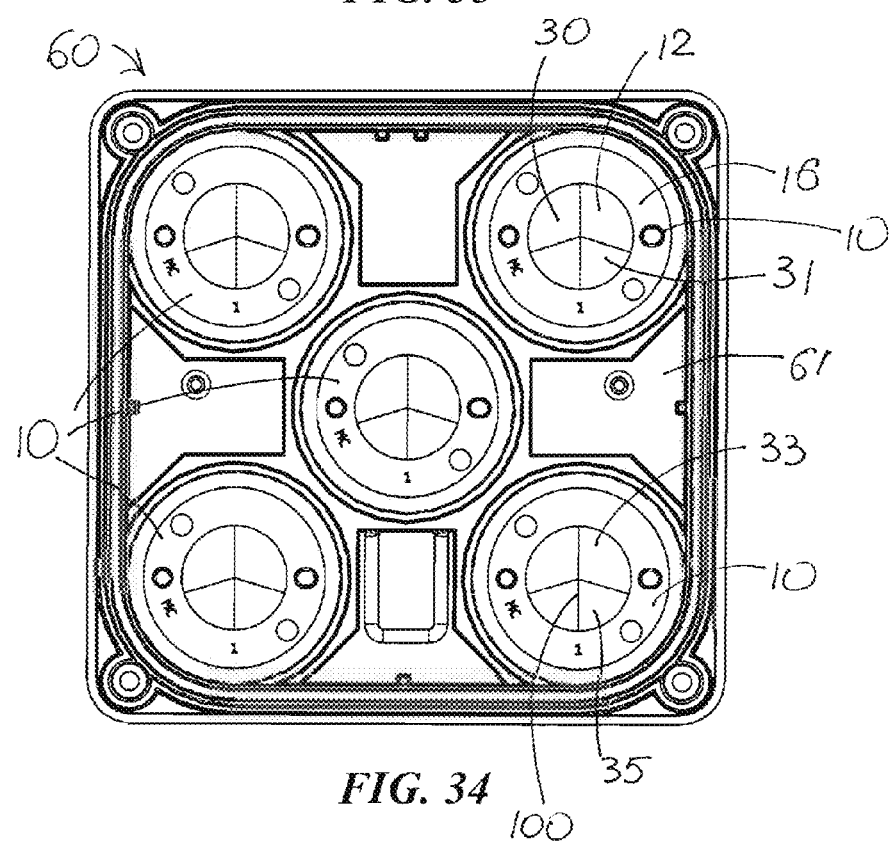
FIG. 34 is a plan view from the light-emitter side of the lighting apparatus of FIG. 30.

FIGS. 28 and 29 illustrate an example of a light fixture 70 incorporating the present invention. Fixture 70 includes a heat-sink structure 71 having a mounting surface 72 with a circuit board 22 on such mounting surface 72. Circuit board 22 supports a plurality of light emitters 20 spaced thereon. An optical member 60 is positioned over circuit board 22. Optical member 60 has a plurality of lenses 10 each in alignment with a corresponding one of emitters 20.

FIGS. 22-27 show light emitter 20 in the form of an LED package 23 which has a primary lens 24 over the at least one LED 25. In such embodiments, the inventive lens is a secondary lens placed over primary lens 24.

Figure 26:
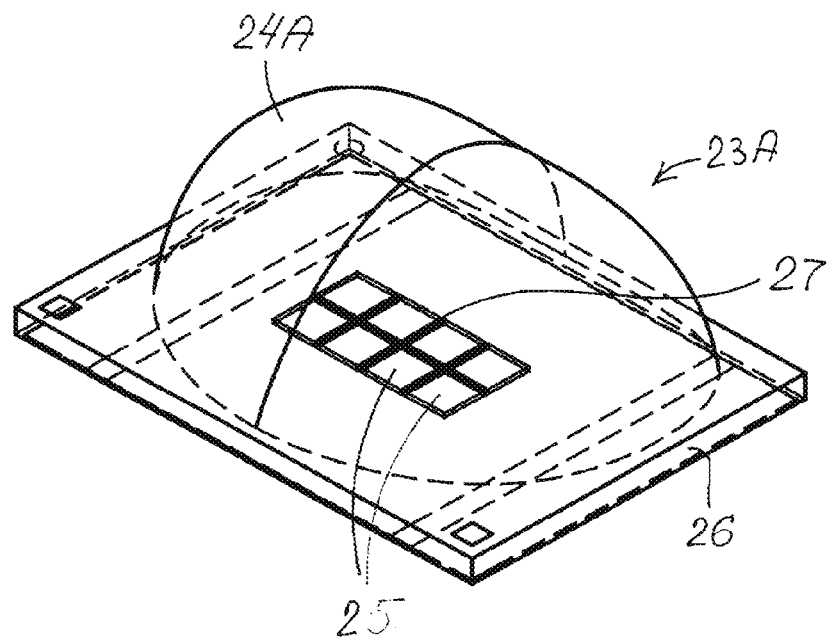
FIG. 26 is an enlarged perspective view of one example of an LED package including an array of eight LEDs on a submount and an asymmetric primary lens overmolded over the LED array.
Figure 27:
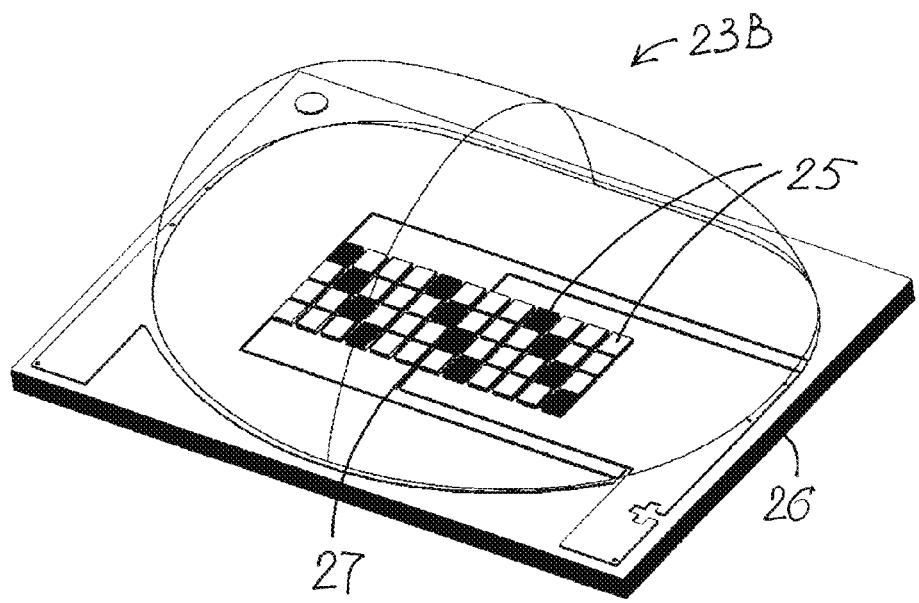
FIG. 27 is an enlarged perspective view of another example of an LED package including an array of forty-eight LEDs on a submount and an asymmetric primary lens overmolded over the LED array.

FIGS. 26 and 27 illustrate exemplary LED packages 23A and 23B each including an array of LEDs 25 on an LED-populated area 27 which has an aspect ratio greater than 1, and primary lens 24 being overmolded on a submount 26 over LED-populated area 27. It is seen in FIG. 28 that the array may include LEDs 22 emitting different-wavelength light of different colors such as including red LEDs along with light green or other colors to achieve appearance of natural white light. Light emitters of the type as LED packages 23A and 23B are described in detail in application Ser. No. 13/441, 558, filed on Apr. 6, 2012, and in application Ser. No. 13/441, 620, filed on Apr. 6, 2012. The contents of both applications are incorporated herein by reference in their entirety.

Figure 22:
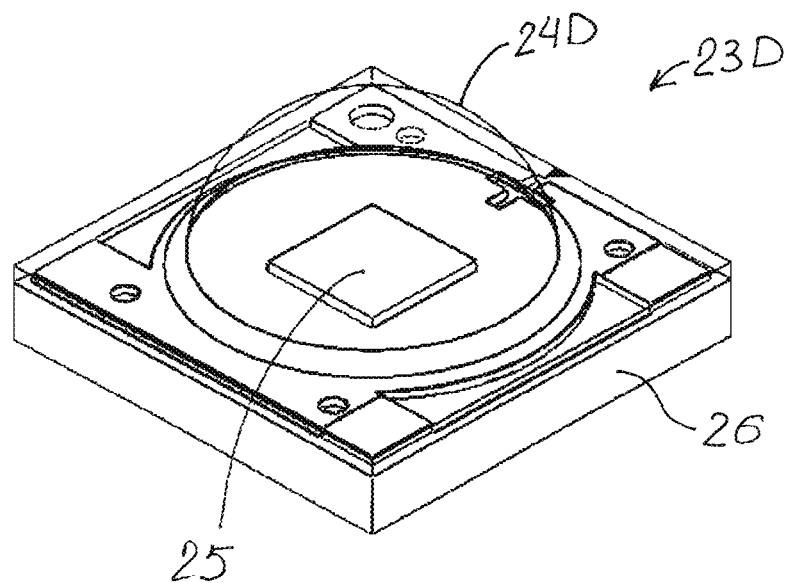
FIG. 22 is an enlarged perspective of an example of the LED emitter being an LED package which has a single LED on a submount with a hemispheric primary lens overmolded over the LED.
Figure 23:
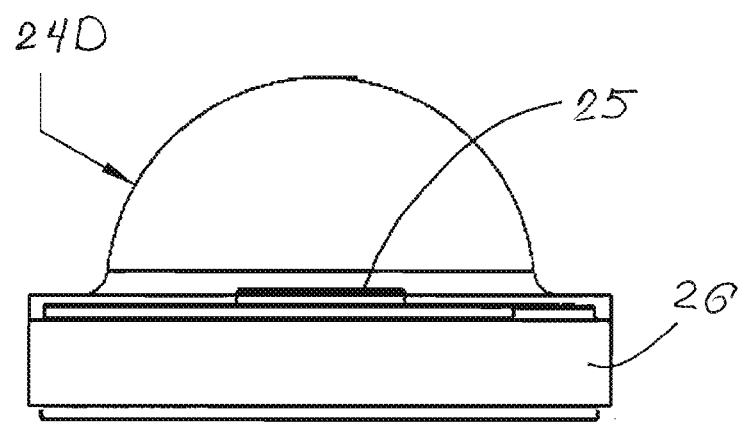
FIG. 23 is an enlarged side view of the LED package of FIG. 22.
Figure 24:
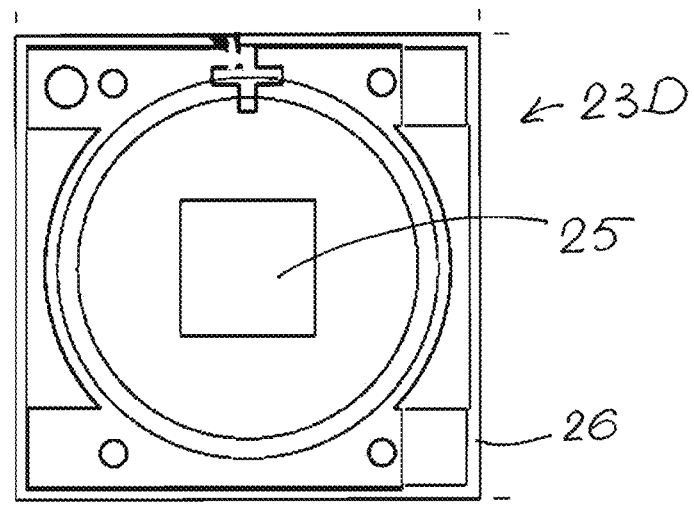
FIG. 24 is an enlarged plan view of the LED package of FIG. 22.

Light emitter 20 may be of the type illustrated in FIGS. 22-24 which show LED package 23D with single LED 25 on a submount 26 and hemispheric primary lens 24D coaxially overmolded on submount 26 over LED 25.

Figure 20:
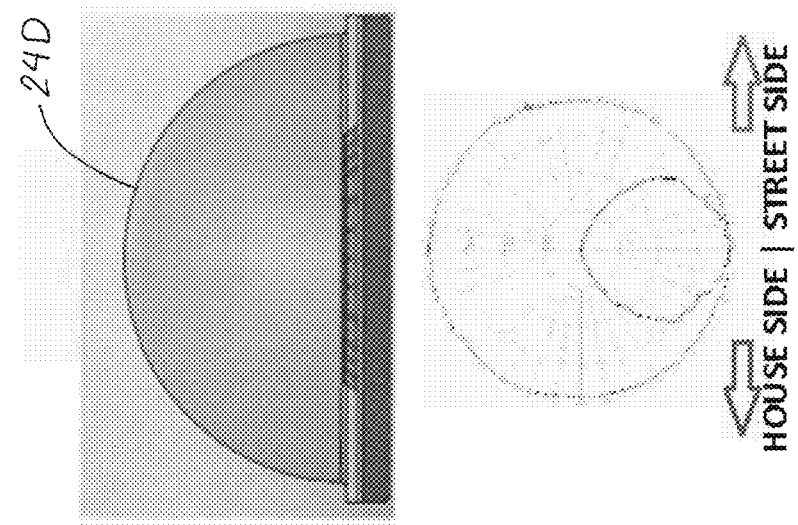
FIG. 20 is a side view of one embodiment of an LED emitter seen in FIG. 14 and having an asymmetric primary lens and showing a polar curve by such asymmetric primary lens.
Figure 25:
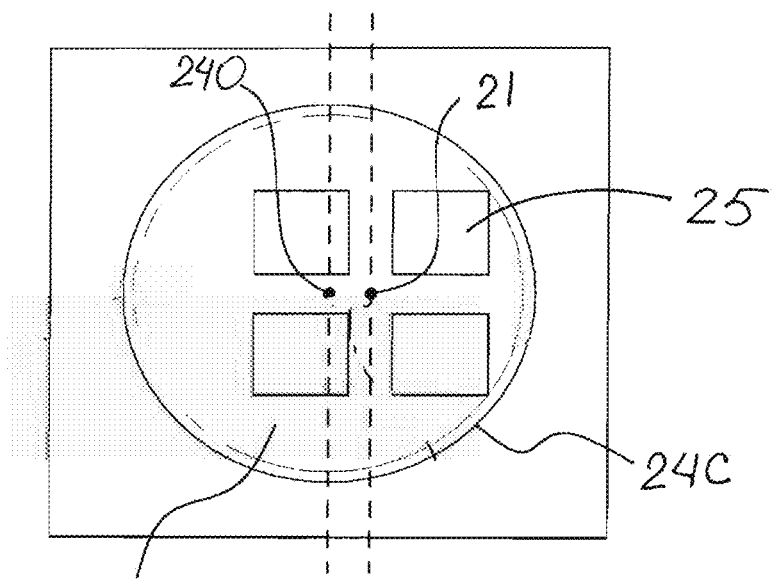
FIG. 25 is an enlarged top view of another exemplary LED package including an array of four LEDs on a submount and a hemispheric primary lens overmolded over the LED array such that the axis of the primary lens is offset from the axis of the LED array.

FIGS. 20 and 25-27 illustrate versions of LED light emitter 20 configured to refract LED-emitted light in a primarily forward direction (i.e., toward preferential side). In each LED package 23A, 23B and 23C, each LED array defines an emitter axis. FIGS. 26 and 27 illustrate primary lens 24A configured to refract LED-emitted light forward. FIG. 25 shows hemispheric primary lens 24C having a centerline 240 offset from emitter axis 21. It should be understood that for higher efficiency, LED emitter 20 may have a primary lens having both its centerline offset from the emitter axis and also being shaped for refraction of LED-emitted light toward preferential side. In FIGS. 20, 26 and 27, primary lens 24A is shown as asymmetric.

Figure 21:
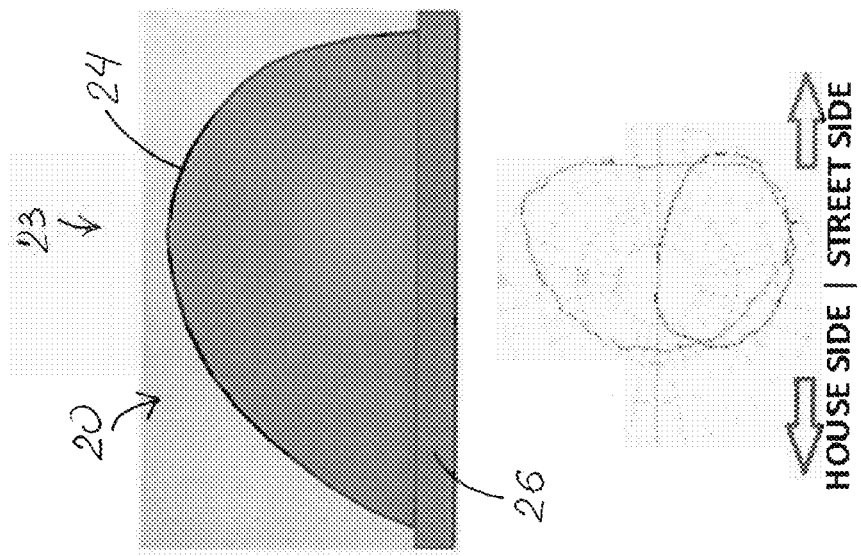
FIG. 21 is a side view of an LED emitter with an hemispherical primary lens and showing a polar curve by such asymmetric primary lens.

FIGS. 20 and 21 illustrate the difference in polar curve of an LED emitter with the asymmetric and with a symmetric dome like primary lens shown in FIG. 21. FIG. 20 shows only 38% of the light going rearwardly which in the reality could be toward a house side. In comparison, FIG. 21 shows about 50% of the light going rearwardly from an LED emitter with a symmetric primary lens as shown in FIG. 21.

It should be noted that the configuration of inventive lens 10 as described above allows for molding of lens 10 in a single-piece mold. In other words, the lens configuration preferably permits easy removal of the lens from the mold without the need for separating the mold pieces as is the case with some lenses that require multiple-piece molds. The inventive lens can be simply pulled out of the mold.

FIGS. 1-4, 12 and 14 show back region 35 of inner surface 30 having a substantially smooth cross-sectionally concave configuration. These Figures also show front region 33 of inner surface 30 being substantially cross-sectionally convex along light-entrance opening 12 into light-receiving cavity 31. Inner surface is shown to have substantially smooth configuration. FIGS. 9 and 10 show light-entrance opening 12 being of a substantially circular configuration.

Such smooth configuration of inner surface 30 and the simplified geometry facilitates accuracy in forming the lens surfaces during molding of lens 10 as compared to lens 80 which includes an inner TIR surface 81 illustrated in FIGS. 13 and 15.

Such simplifying of the geometry of lens 10 is facilitated by combination of lens 10 with an LED emitter 20 which has an asymmetric primary lens 24, as shown in FIG. 14. Since asymmetric primary lens 24 creates Type III distribution of LED emitted light (as shown in FIG. 20), inner surface 30 of lens 10 receives light which is already directed primarily forward. This improves efficiency of lens 10 while utilizing simplified geometry of the lens surfaces which facilitates accuracy in lens manufacturing.

Figure 7:
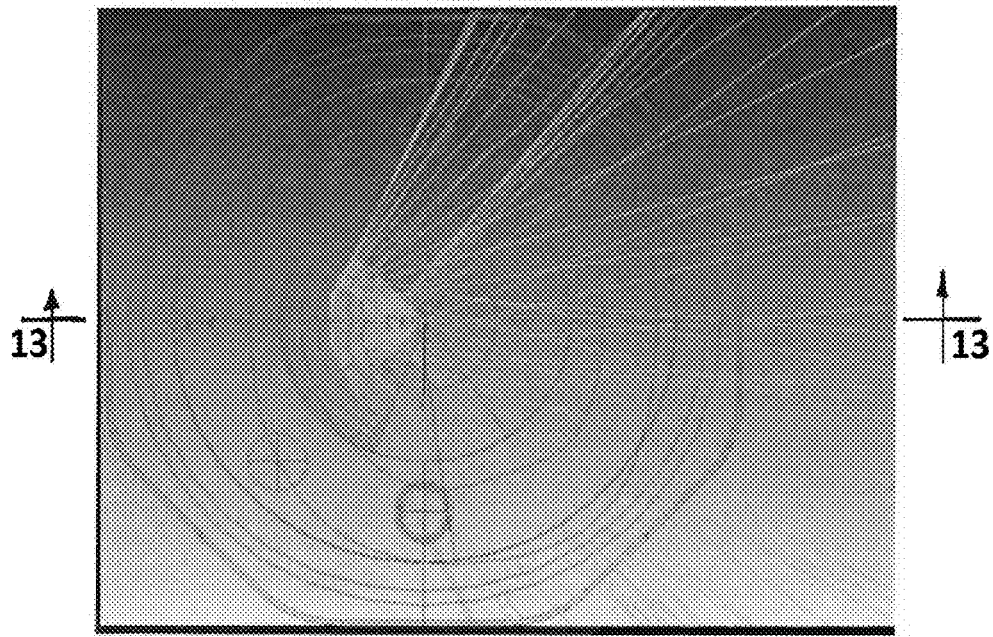

The external TR feature in the form of a back portion 51 of outer surface 40 maintains substantially similar lateral angles of distribution of light by lens 10 as by lens 80. This may be seen in comparing FIG. 10 which schematically illustrates lateral distribution of light by lens 10 and FIG. 7 which schematically illustrates lateral distribution of light by lens 80. However, back outer-surface portion 51 facilitates improvement in light distribution by intercepting and forwardly redirecting light that would otherwise escape rearwardly, as seen in the comparative illustration of FIGS. 16 and 17.

Figure 6:
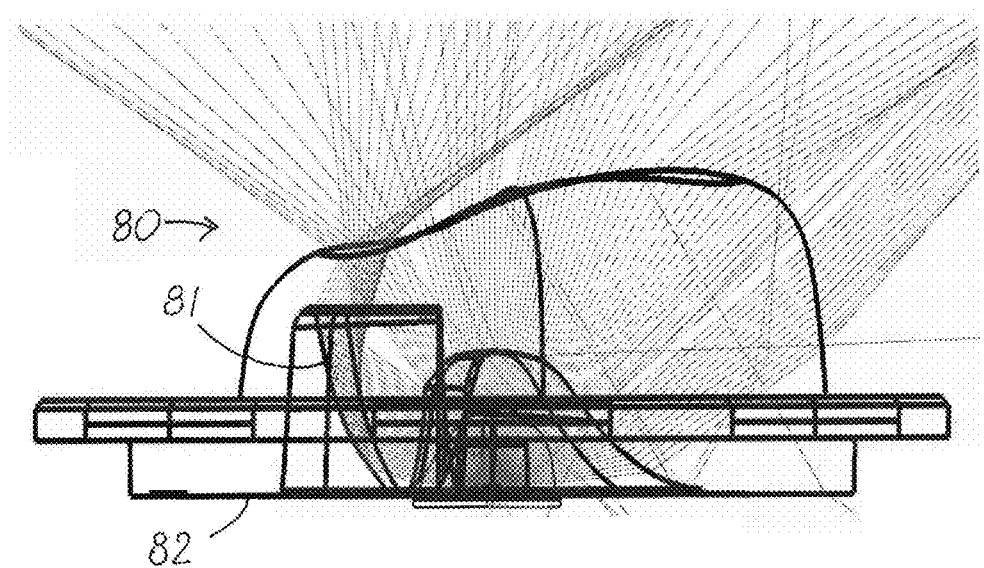
FIG. 6 is a side elevation of yet another lens which has a TIR surface extending from the surface adjacent the LED emitter and terminating before reaching the outer refracting lens surface.

FIGS. 12-15 illustrate that, due to nature of intensity distribution, there is more high intensity rearward light in zone 2 (seen in FIG. 14) than in zone 1 (seen in FIG. 15). FIGS. 6 and 15 show that much of rearward light of zone 2 is insufficiently captured with TIR surface 81 extending from positions adjacent the base surface and terminating prior to reaching the outer output surface of lens 80. In lens 80 with base-adjacent TIR surface 81, higher angle light escapes rearwardly through areas beyond base-adjacent TIR 81, such light being of higher intensity than light being intercepted and forwardly reflected by the base-adjacent TIR surface. Furthermore, light along the base surface was passing through the base-adjacent TIR surface due to very low angles preventing TIR of such light.

FIGS. 2-4 show that back surface portion 51 which is spaced from the base surface captures and reflects a majority of such higher angles rearward light, thereby improves efficiency of the resulted light distribution by lens 10 according to the present invention.

FIGS. 14 and 15 illustrate that back portion 51 of outer surface 40 is more effective for intercepting and forwardly reflecting through TIR light distributed by asymmetric primary lens 24 than TIR surface 81. As seen in FIGS. 12-15, surface 81 is positioned closer to LED emitter 20 than back outer-surface portion 51 of inventive lens 10 positioned with respect to LED emitter 20. FIG. 15 shows that, due to such close spacing of inner TIR surface 81 with respect to LED emitter 20 and a base surface 82, much of rearward light is emitted at angles beyond TIR surface 81. FIG. 15, as well as FIGS. 2-4 and 6, that more of such rearward light is intercepted reflected forward by the outer surface portion 51 according to the present invention. As also seen in FIGS. 16 and 17, inventive lens 10 configured according to the present invention directs more useful light toward the roadway and achieves better cutoff of light near the house side of the pole than lens 80.

Figures 16, 17:
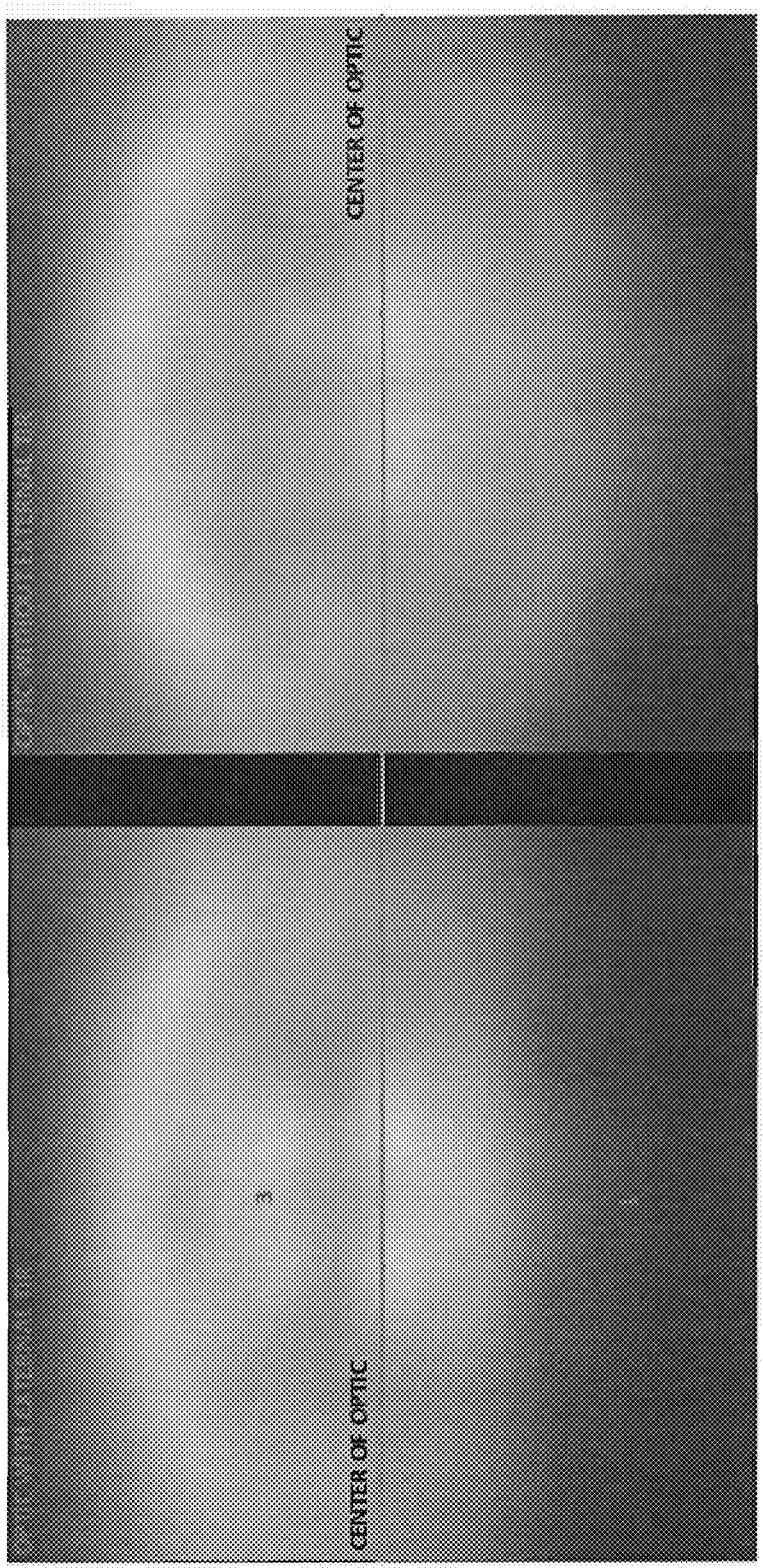
FIG. 16 is a luminance rendering of light distribution by the lens of FIG. 1 on an illuminated surface substantially normal to the emitter axis.
FIG. 17 is a luminance rendering of light distribution on an illuminated surface substantially normal to the emitter axis by the lens of FIG. 5 with an outer surface lacking a back portion configured for TIR of LED light emitted rearwardly.

FIGS. 16-19 show comparisons of performance of lens 10 of the present invention shown in FIGS. 16 and 18 with performance of other lenses. In particular, FIG. 17 shows the escaped rearward light. FIG. 16 shows the effect of such wasted light being forwardly redirected with a lend according to the present invention, thereby providing better roadway illumination while minimizing illumination of undesirable areas indicated by numeral 1.

Roadway Target Efficacy (RTE) is a defined metric that measures of how well the overall light distribution covers the roadway has been a main focus of recent roadway layouts. In a continuous effort to increase RTE, optical designs have been trying to get the majority of the light forward. The more light on the roadway, the higher the RTE. As a result, less light and less power is required to meet the desired layout requirement. The lens according to the present invention utilizes an outer surface portion configured for Total Internal Reflection (TIR) to prevent light from escaping backward, and directs it onto the roadway. The equation for calculating RTE is RTE=$(I_{avg})(A_{road})(LLF)/L_{total}$, where $I_{avg}$=Average illuminance on the RP-8 roadway, $A_{road}$=Area of roadway between poles, LLF=Light Loss Factor, and $L_{total}$=Total lumens from individual fixture. Optics are typically designed to certain roadway requirements, and they must meet those metrics efficiently.

FIGS. 18 and 19 show a comparison of luminance renderings by a higher RTE of the optic according to the present invention (FIG. 18) versus another optic with a lower RTE (FIG. 19). In FIG. 18, the optic according to the present invention has very good cutoffs near the curb line which gives it an 11.3% RTE advantage compared to another optic which luminance rendering is shown in FIG. 19.

While the principles of this invention have been described in connection with specific embodiments, it should be understood clearly that these descriptions are made only by way of example and are not intended to limit the scope of the invention.

The invention claimed is:

1. A lens for primarily forward distribution of light from a light emitter which has an emitter axis in a front-to-back centerplane, comprising:
   a base surface adjacent the emitter and forming a light-entrance opening;
   an inner surface defining a light-receiving cavity extending from the light-entrance opening;
   an outer light-output surface including front and back regions adjoined by a middle region together outlining the outer light-output surface adjacent to the base surface, the front region outlining lateral positions adjacent to the base surface which are farther from the front-to-back centerplane than lateral positions adjacent to the base surface outlined by the middle and back regions.

2. The lens of claim 1 wherein the distal end of the back surface portion is at positions closer to the base surface than outermost positions of the front region of the outer surface.

3. The lens of claim 1 wherein the back region of the outer surface comprises a back portion configured for forward total internal reflection (TIR) of rearward light received from the inner surface.

4. The lens of claim 1 wherein, in the front-to-back centerplane, the emitter axis is no farther from the back portion of the outer surface than from a back edge of the light-entrance opening.

5. The lens of claim 4 wherein the light-entrance opening is substantially circular.

6. The lens of claim 4 wherein the light emitter comprises at least one LED enclosed by a primary lens which has an outer surface shaped for primarily forward refraction of light from the at least one LED.

7. The lens of claim 6 wherein the outer surface of the primary lens is asymmetric in planes substantially parallel to the front-to-back centerplane.

8. A lens for primarily forward distribution of light from a light emitter which has an emitter axis in a front-to-back centerplane, comprising:
   a base surface adjacent the emitter and forming a light-entrance opening;
   an inner surface defining a light-receiving cavity extending from the light-entrance opening;
   an outer surface including front and back regions adjoined by a middle region laterally bounding the back region along the base surface, the back region comprising a back portion which extends transverse the front-to-back centerplane away from the base surface such that, alone the front-to-back centerplane, the emitter axis is no farther from the back region than from the middle region, the back portion being configured for forward total internal reflection (TIR) of rearward light received from the inner surface.

9. The lens of claim 8 wherein the back portion of the back region is disposed in a recess defined by the middle region along the base surface.

10. The lens of claim 8 wherein the light emitter comprises at least one LED enclosed by a primary lens which has an outer surface shaped for primarily forward refraction of light from the at least one LED.

11. The lens of claim 10 wherein the outer surface of the primary lens is asymmetric in planes substantially parallel to the front-to-back centerplane.

12. The lens of claim 11 wherein the inner surface has front and back regions, the back inner-surface region having a substantially smooth cross-sectionally concave configuration.

13. The lens of claim 12 wherein:
   the front region of the inner surface is substantially cross-sectionally convex along the light-entrance opening into the light-receiving cavity; and
   the light-entrance opening is substantially circular.

14. The lens of claim 13 wherein the inner surface is substantially smooth.

15. The lens of claim 8 wherein lateral positions of the front region of the outer surface are farther from the front-to-back centerplane than lateral positions of the middle and back regions of the outer surface.

16. The lens of claim 15 wherein the back region of the outer surface comprises a distal end with the back portion extending rearwardly therefrom toward the base surface, the distal end being closer to the base surface than outermost positions of the front region of the outer surface.

17. The lens of claim 16 wherein the back region of the outer surface comprises a minor forward portion extending forwardly from the distal end to adjoining the middle region, the minor forward portion being positioned for receiving light reflected from the back portion and refracting the received light in a desired direction.

18. The lens of claim 17 wherein the front and middle regions of the outer surface have a substantially smooth configuration.

19. The lens of claim 8 further comprising a peripheral region extending radially outwardly from the light-entrance opening and including the base surface.

20. The lens of claim 19 wherein the peripheral region comprises a flange extending radially away from the outer surface.

21. A lens for primarily forward distribution of light from a light emitter which has an emitter axis in a front-to-back centerplane, comprising:
   a base surface adjacent the emitter and forming a light-entrance opening;
   an inner surface defining a light-receiving cavity and including front and back regions extending from the light-entrance opening to an innermost region of the cavity; and
   an outer surface including front and back regions adjoined by a middle region, the back region of the outer surface comprising a back portion extending in a direction away from the base surface and terminates with a distal end which is closer to the base surface than outermost positions of the outer-surface front region, the back portion being configured for forward total internal reflection (TIR) of rearward light received from the inner surface.

22. The lens of claim 21 wherein
   the back portion extends in a direction away from the base surface to a distal end from positions which are closer to the base surface than the innermost cavity region.

23. The lens of claim 22 wherein the back region comprises a minor forward portion extending from the distal end toward the emitter to adjoining the middle region, the minor forward portion positioned for receiving light reflected from the back portion.

24. The lens of claim 23 wherein the minor forward portion is configured for refraction of the received light in a desired direction.

25. The lens of claim 22 wherein the back portion of the back region is disposed in a recess defined by the middle region along the base surface.

26. The lens of claim 22 wherein the emitter axis is no farther from the back portion of the outer surface than from rearmost positions of the light-entrance opening along the back region of the inner surface.

27. The lens of claim 26 wherein the back region of the inner surface has a substantially smooth concave configuration.

28. The lens of claim 26 wherein the distal end of the back surface portion is at positions closer to the base surface than outermost positions of the front region of the outer surface.

29. The lens of claim 22 wherein the light emitter comprises at least one LED enclosed by a primary lens which has an outer surface shaped for primarily forward refraction of light from the at least one LED.

30. The lens of claim 21 wherein:
   the back region of the outer surface comprises a minor forward portion positioned for receiving and refracting light reflected from the back portion, the minor forward portion extending from the distal end to adjoin the middle region; and
   the front and middle regions of the outer surface are smoothly adjoined and each have a substantially smooth configuration.

31. The lens of claim 21 wherein the back portion of the outer surface terminates laterally at positions closer to the front-to-back centerplane than lateral edges of the light-entrance opening.

32. The lens of claim 31 wherein lateral positions of the front region are farther from the front-to-back centerplane than lateral positions of the middle and back regions.

33. The lens of claim 32 wherein, in the front-to-back centerplane, the emitter axis is no farther from the back portion of the outer surface than from a back edge of the light-entrance opening.

34. The lens of claim 33 wherein the light emitter comprises at least one LED enclosed by a primary lens which has an outer surface shaped for primarily forward refraction of light from the at least one LED.

35. A lens for primarily forward distribution of light from a light emitter having an emitter axis, comprising:
   a base surface adjacent the emitter and forming a light-entrance opening;
   an inner surface defining a light-receiving cavity and including front and back regions extending from the light-entrance opening to an innermost region of the cavity, the back region of the inner surface having a substantially smooth cross-sectionally concave configuration,
   the front region of the inner surface is a substantially cross-sectionally convex along the light-entrance opening into the light-receiving cavity; and
   an outer surface including front and back regions adjoined by a middle region, the back region of the outer surface comprising a back portion configured for forward total internal reflection (TIR) of rearward light received from the inner surface.

36. The lens of claim 35 wherein:
   the light-entrance opening is substantially circular; and
   the inner surface is substantially smooth.

37. The lens of claim 35 wherein
   the back portion extends transverse the front-to-back centerplane and terminates laterally at positions which are closer to the front-to-back centerplane than lateral positions of the front region of the outer surface.

38. The lens of claim 37 wherein lateral positions of the outer-surface front region are farther from the front-to-back centerplane than lateral positions of the outer-surface middle and back regions.

39. The lens of claim 37 wherein, in the front-to-back centerplane, the emitter axis is no farther from the back portion of the outer surface than from a back edge of the light-entrance opening.

40. The lens of claim 39 wherein the light-entrance opening is substantially circular.

41. The lens of claim 39 wherein the light emitter comprises at least one LED enclosed by a primary lens which has an outer surface shaped for primarily forward refraction of light from the at least one LED.

42. The lens of claim 41 wherein the outer surface of the primary lens is asymmetric in planes substantially parallel to the front-to-back centerplane.

* * * * *